United States Patent [19]

Landt et al.

[11] Patent Number: 4,462,009
[45] Date of Patent: Jul. 24, 1984

[54] BROADBAND FILTER AND TUNING SYSTEM

[75] Inventors: Harvey L. Landt; Glenn R. Snider, both of Cedar Rapids, Iowa

[73] Assignee: Rockwell International Corporation, El Segundo, Calif.

[21] Appl. No.: 381,671

[22] Filed: May 25, 1982

[51] Int. Cl.$^3$ .......................................... H03H 11/04
[52] U.S. Cl. .................... 333/17 R; 455/73; 455/84; 455/340
[58] Field of Search ............ 333/17 R, 167, 174; 455/73, 77, 84, 120, 125, 340

[56] References Cited
U.S. PATENT DOCUMENTS

| | | | |
|---|---|---|---|
| 2,976,408 | 3/1961 | Colaguori | 455/340 X |
| 2,991,436 | 7/1961 | Banton | 333/17 X |
| 3,564,129 | 2/1971 | Blaxtan | 333/17 X |

*Primary Examiner*—Paul L. Gensler
*Attorney, Agent, or Firm*—Richard K. Robinson; George A. Montanye; H. Fredrick Hamann

[57] ABSTRACT

A method and apparatus is disclosed for automatically and exactly tuning a boradband filter. Upon the detection of a tuning change, the filter is automatically switched end to end so that the output terminal of the filter is connected to the radio frequency power source. Radio frequency in this application refers to any signals whose frequency facilitates propagation of data via electromagnetic waves. The input terminal is terminated into a known load such as 50 ohms and C1, an input variable reactance is adjusted until a 90° phase relationship exists between the input resonator and the output resonator's node voltages. These actions set the exact tune condition for the broadband filter. The filter is then automatically reconnected in its normal operating position with its input terminal being connected to the RF power source and its output terminal being connected to its load, such as an antenna, and additional adjustments performed by varying the capacitance of the output capacitance C2 and the coupling capacitance C3.

13 Claims, 24 Drawing Figures

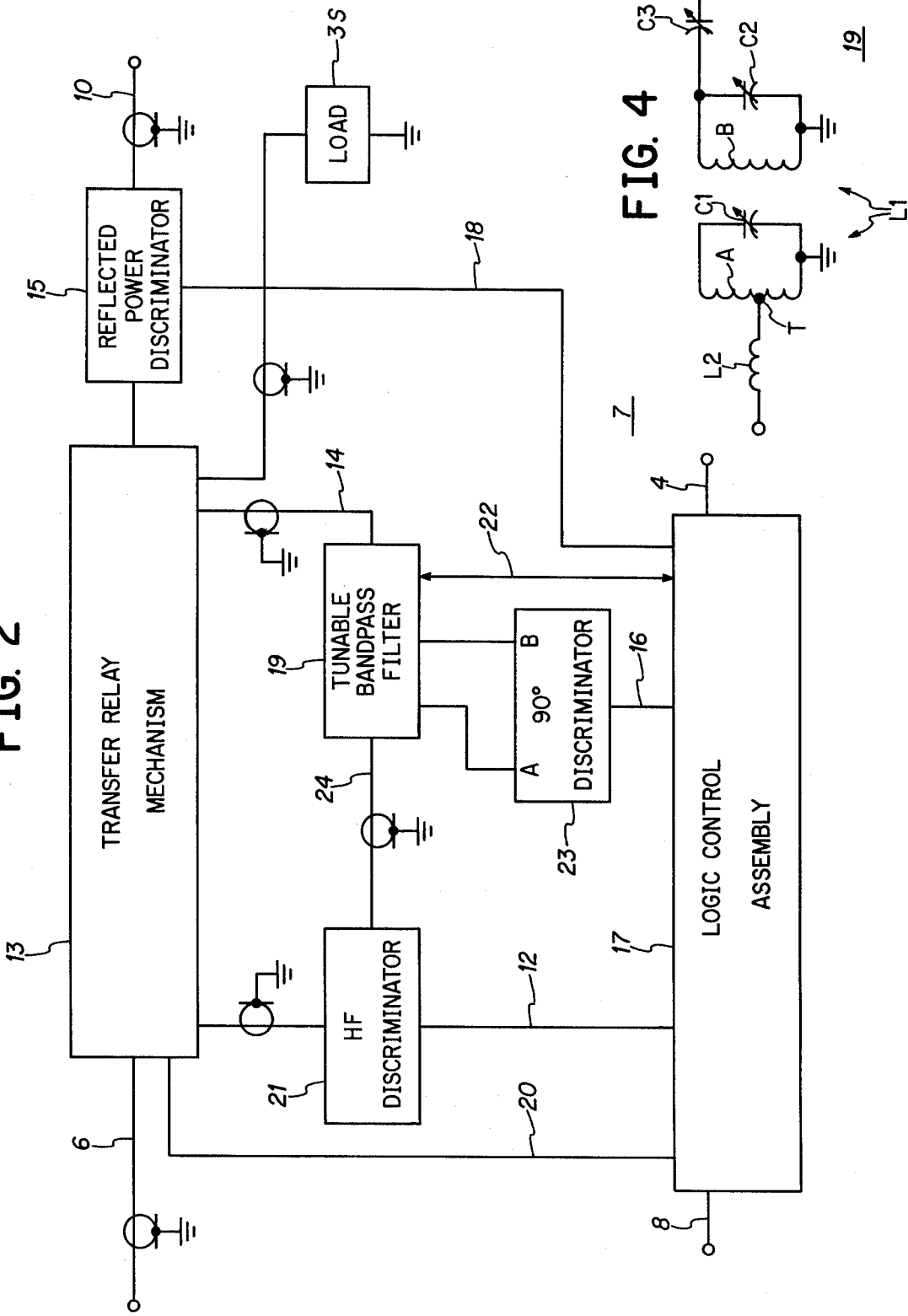

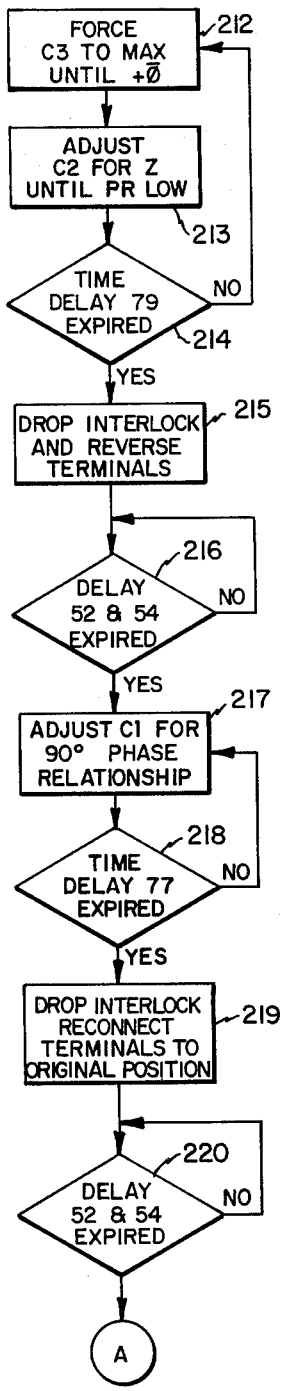
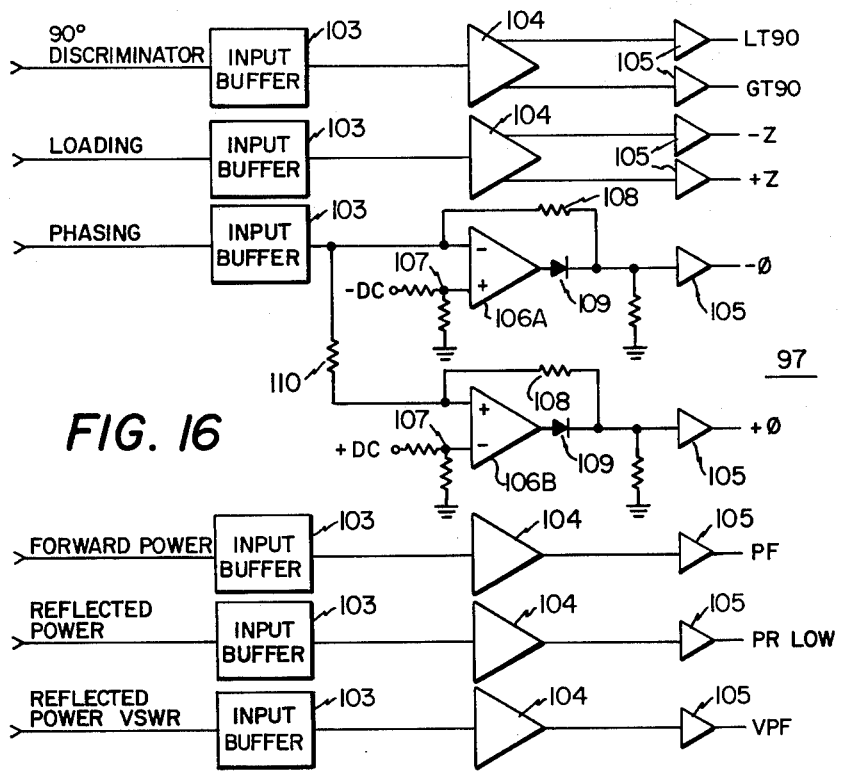
FIG. 16
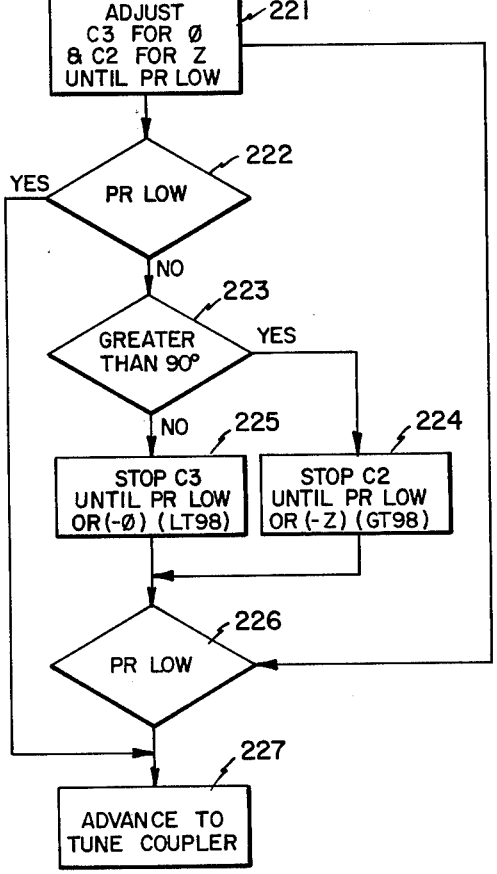
FIG. 20

BROADBAND FILTER AND TUNING SYSTEM

BACKGROUND OF THE INVENTION

This invention relates to a method and apparatus for tuning a broadband filter and in particular to an automatic tuning system for a broadband filter.

In the prior art there are many approximate methods employed for tuning of broadband filters. In general, a broadband filter has an input resonator, an output resonator and a coupling capacitor. The input resonator includes a primary winding of a transformer that is resonated by a variable capacitor, Ci; and the output resonator includes the secondary winding of the transformer which is resonated by a second variable capacitor, Co. An impedance matching element is provided by a variable coupling capacitor, Cc. The general prior art method of tuning the resonator usually provided for shorting Co, or greatly mistuning the output resonator, and adjusting Ci until a series resonance (phasing zero) is obtained at the filter's input. Phasing zero is defined as the condition in which the imaginary component of the measured impedance of the filter's input is zero. Alternatively, Ci may be adjusted for a parallel resonance (phasing zero) at the filter's input also. Other methods provide for adjusting Ci until the absolute value of the input resonator's impedance is at a selected resistance such as 50 ohms. There are still other methods which try to minimize through adjustment of Ci the reflected power at the input terminal of the broadband filter in conjunction with a high loss attenuator. All of the above prior art methods are inexact, complicated and difficult to implement especially in the situation where the tuning of the broadband filter is performed automatically and without manual intervention.

SUMMARY OF THE INVENTION

A method and apparatus is disclosed for automatically and exactly tuning a broadband filter. Upon the detection of a tuning change, the filter is automatically switched end to end so that the output terminal of the filter is connected to the radio frequency power source. Radio frequency in this application refers to any signals whose frequency facilitates propagation of data via electromagnetic waves. The input terminal is terminated into a known load such as 50 ohms and Ci, an input variable reactance, is adjusted until a 90° phase relationship exists between the node voltage of the input resonator and the output resonator. These actions set the exact tune condition for the input resonator. The filter is then automatically reconnected in its normal operating position with its input terminal being connected to the RF power source and its output terminal being connected to a load, such as an antenna, and additional adjustments performed by varying the capacitance of the output capacitance, Co, and the coupling capacitance, Cc.

There are two embodiments of a tunable broadband filter provided, one being the typical two pole filter that includes an input resonator and output resonator wherein each resonator has a variable reactance in the form of a variable capacitor. The other embodiment of the filter provides for a high Q, the quality of merit of filters, multiband resonator with the coils comprising the resonator being contained within a common enclosure having a small space between the coils. In the preferred embodiment the filter is able to cover the range of from 1.6 MHz to 30 MHz. The filter has two resonators each of which consists of 3 coils and a tuning capacitor. The coils are series connected and the inductance of the resonator may be varied through the activation of relay contacts which causes the selected coil to be opened or shorted at a preselected inductance.

A logic control assembly is disclosed and implements the detection of the tuning requirement and the steps of tuning the bandpass filter to the desired frequency.

It is the objective of this invention to provide an exact method for tuning a bandpass filter.

It is another objective of the invention to provide an apparatus for implementing the exact method of tuning a bandpass filter according to the invention.

It is yet another objective of the invention to provide a multiband bandpass filter that can be rapidly tuned to different bands of operating frequencies automatically.

BRIEF DESCRIPTION OF THE DRAWINGS

In order that the invention may be readily carried into practice, a number of embodiments will now be described in detail by way of example, with reference to the accompanying drawings in which:

FIG. 2 is a block diagram of the bandpass filter of FIG. 1;

FIG. 4 is a schematic diagram of one embodiment of a bandpass filter according to the invention;

FIGS. 6 through 16 are schematic diagrams of the logic control assembly according to the invention;

FIGS. 18 through 22 are flow diagrams of the functions performed by the control logic assembly of FIG. 5.

DETAILED DESCRIPTION OF THE PREFERRED EMBODIMENT

Figure 1:
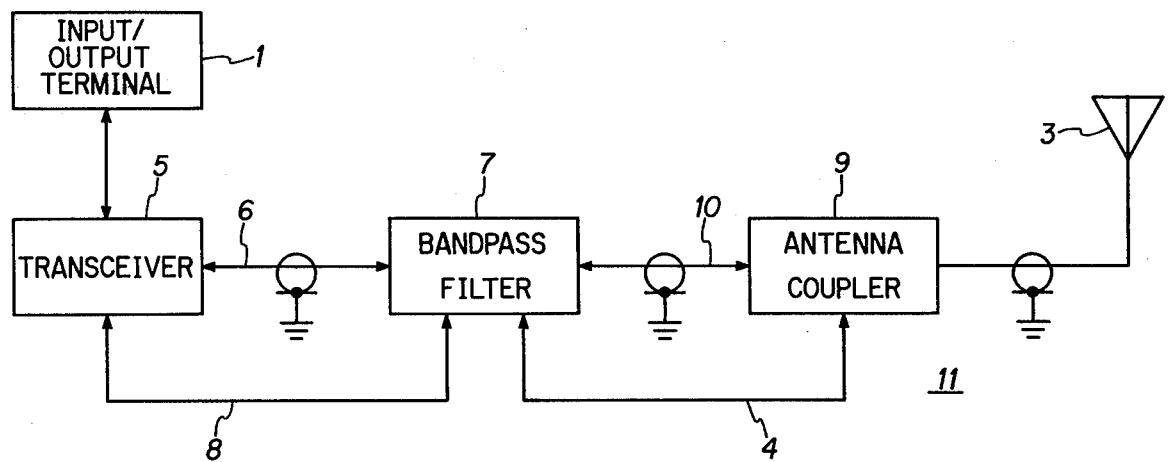
FIG. 1 is a block diagram of a transmission system incorporating a tunable bandpass filter according to the invention.

In FIG. 1, to which reference should now be made, there is shown a radio transmission system 11 that includes an input/output terminal 1. The input/output terminal 1 in the preferred embodiment is part of the transceiver 5 which is a device or devices such as the Model HF-8010 receiver/exciter and the Model HF-8023 power amplifier unit manufactured by Rockwell International Corporation but may be any other device known in the Art that conveys the data to be transmitted, tuning information, and the keyline, which is often referred to as the PTTK line or push-to-talk key line to a transceiver 5, and may also accept data received by the transceiver 5. The transceiver 5 either transmits or receives radio signals that are encoded with data and provides to a bandpass filter 7 the necessary tuning information for both the bandpass filter 7 and the antenna coupler 9. The transceiver 5 in the preferred embodiment is a multiband transceiver that operates in the frequency range of 1.6 to 30 MHz which is divided into 3 bands of transmission frequencies. The transceiver 5 provides the radio signal to and receives the radio signal from the bandpass filter 7 via conductor 6 and provides the tune start command to the bandpass filter 7 via conductor bundle 8 as well as the key line which is derived from the push-to-talk key. The bandpass filter 7 filters the radio frequency signal that is present on conductor 6 by providing out-of-band or off frequency rejection to unwanted signals. The filtered signal is coupled via conductor 10 to an antenna coupler 9 which receives tuning information from the bandpass filter via conductor bundle 4. The antenna coupler 9 in the preferred embodiment is the Model HF-8040 unit manufactured by Rockwell International Corporation but may be any one of the tunable antenna couplers known in the Art that will provide impedance matching at a signal frequency between the series connection of the bandpass filter 7 and transceiver 5 and the load which is an antenna 3. The bandpass filter 7 also passes to the antenna coupler tuning information and receives from the antenna coupler 9 an indication that tuning is complete. The antenna coupler 9, as was said before, matches the bandpass filter 7 to the antenna 3 such that at the band center to which the bandpass filter is tuned, the bandpass filter will see on its output terminal to which conductor 10 is connected a known impedance which in the case of a radio transmission system is required by convention to be 50 ohms.

Figure 3:
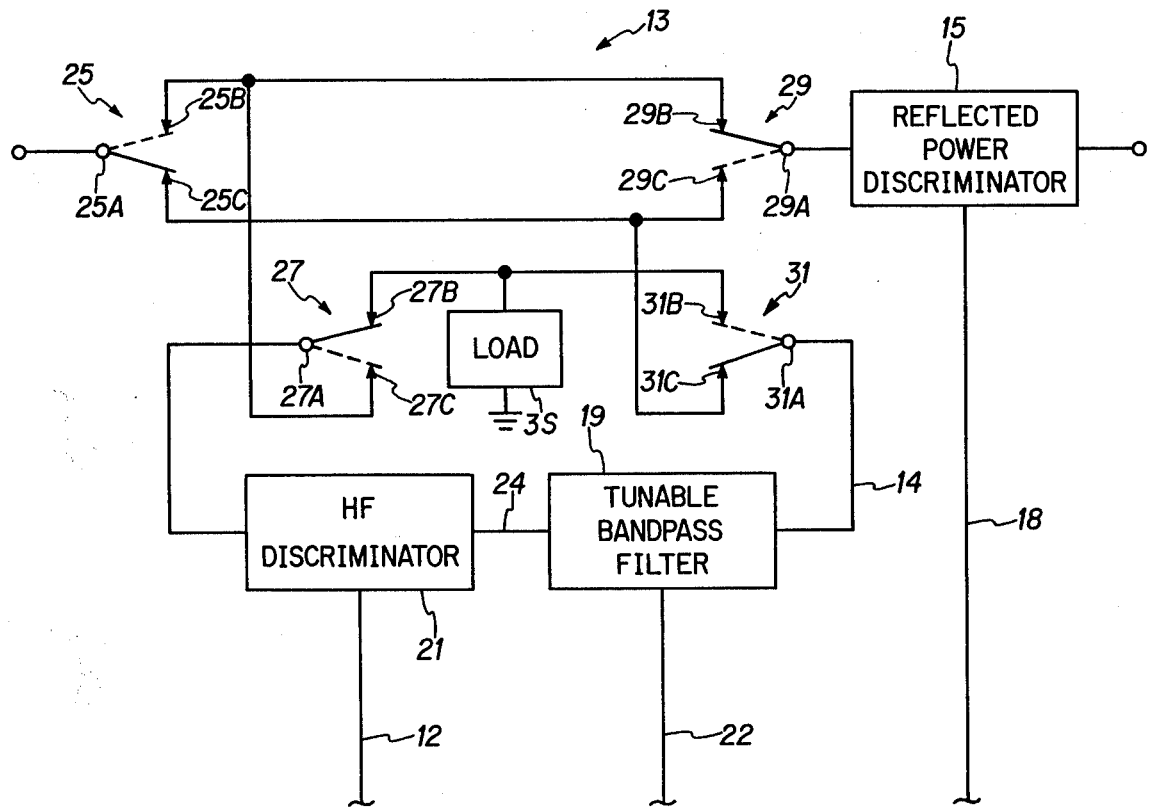
FIG. 3 is a block diagram of the transfer mechanism that is part of the tunable bandpass filter of FIGS. 1 and 2.

The bandpass filter 7 is illustrated in more detail in FIG. 2 to which reference should now be made. A transfer relay mechanism 13 in an operate mode directs the transmission which is in the form of a radio signal to a tunable bandpass filter 19 via a high frequency (HF) discriminator 21. The HF discriminator 21 detects the phase of the signal, the impedance of the signal, the forward power that is being applied to the bandpass filter 7 by the transceiver 5 and the reflected power that is being reflected back from the tunable bandpass filter 19. This information is applied to a control logic assembly 17 via conductor bundle 12. The radio signal passes through the HF discriminator 21 to the tunable bandpass filter 19 for filtering, then back to the transfer relay mechanism 13 via conductor 14 which passes the radio signal to a reflected power discriminator 15 and to the antenna 3 via conductor 10. The reflected power discriminator 15 monitors the reflected power that is reflected back from the antenna 3 and provides a signal representative of the monitored reflected power to the logic control assembly 17 via the conductor 18. The logic control assembly 17 upon receipt of a tune start command signal on conductor bundle 8 from the transceiver 5 will initiate tuning of the tunable bandpass filter 19. Part of the tuning procedure provides for reversing the connection of the tunable bandpass filter 19 through the switching of relays that are contained within the transfer relay mechanism 13. Conductor bundle 20 will carry signals to the transfer relay mechanism 13 that will cause it to reverse the connection of the tunable bandpass filter 19 and connect the HF discriminator 21 to a substitute load 3S (as shown in FIG. 3) and conductor 6 to conductor 14. Upon completion of the reversal of the connection of the bandpass filter 19 the logic control assembly 17 tunes the bandpass filter 19 via tuning signals that are present on conductor bundle 22. A 90° discriminator monitors the signal that is present on terminal A which is connected to conductor 24 and terminal B which is connected to terminal 14 until there exists a 90° phase relationship between the signal present on terminal A as compared to the signal that is present on terminal B. At this point in time the logic control assembly 17 reconnects the HF discriminator 21 to conductor 6 to facilitate the flow of radio signals from conductor 6 through the HF discriminator 21 and the bandpass filter 19 which is also reconnected to conductor 10 by the transfer relay mechanism 13. In the preferred embodiment, as will be discussed later, additional tuning may be performed on the bandpass filter 19 at the completion of the reconnection of the HF discriminator to conductor 6 and the conductor 14 to conductor 10.

The operation of the transfer relay mechanism 13 may be more fully understood by referring to FIG. 3 which shows the tunable bandpass filter 19 connected in the reverse direction portion of the tune mode. The first relay 25 in the embodiment shown in FIG. 3 has terminal 25A connected to 25C. This diverts the radio signal to terminal 31C of relay 31. Relay 31 is activated such that terminal 31C is connected to terminal 31A applying thereby the input signal to the series connection of the output terminal of the tunable bandpass filter 19, the HF discriminator 21 and relay 27. The substitute load 3S is connected to terminal 27A via terminal 27B in the arrangement shown in FIG. 3. In the operate mode, or forward direction, the first relay 25 is activated such that terminal 25A is in electrical contact with terminal 25B diverting the radio frequency signal to terminal 27C. The second relay 27 is activated such that terminal 27A is in contact with terminal 27C conducting the radio signal through the HF discriminator 21 to the tunable bandpass filter 19. The output of the tunable bandpass filter 19 is conducted to terminal 31A of the fourth relay 31 via conductor 14. The fourth relay 31 is activated such that terminal 31A is connected to terminal 31C facilitating the conduction of the filtered radio signal to terminal 29C of the third relay 29. When the third relay 29 is in the state where terminal 29A is connected to terminal 29C then the filtered radio signal is applied to the reflected power discriminator 15, the output of which is connected to the antenna 3 via conductor 10.

FIG. 4 is a schematic diagram of a tunable bandpass filter 19 according to the invention. A transformer L1 has a primary winding A that has an input capacitor C1 connected across it's two terminals. An input signal is applied to a first resonator that includes the primary winding A and the input capacitor C1 via an input inductor L2 to a tapped winding T on the primary winding A. The primary winding A in this circuit arrangement will thus act like an autotransformer. The resonance frequency of the first resonator is variable and dependent on the reactance of the input capacitor C1 and the primary winding A. A second resonator is provided by the secondary winding B and the output capacitor C2. The resonance frequency of the second resonator is also variable and is dependent upon the reactance of the secondary winding B and the output capacitor C2. The bandpass frequency is dependent, of course, on the resonance frequency of the first and second resonators and the magnetic coupling between the two resonators. A coupling capacitor C3 connected from one junction of the secondary winding and the output capacitor C2 to the reflected power discriminator 15 and is made variable to provide impedance matching between the output resonator and the antennas.

Figure 5A:
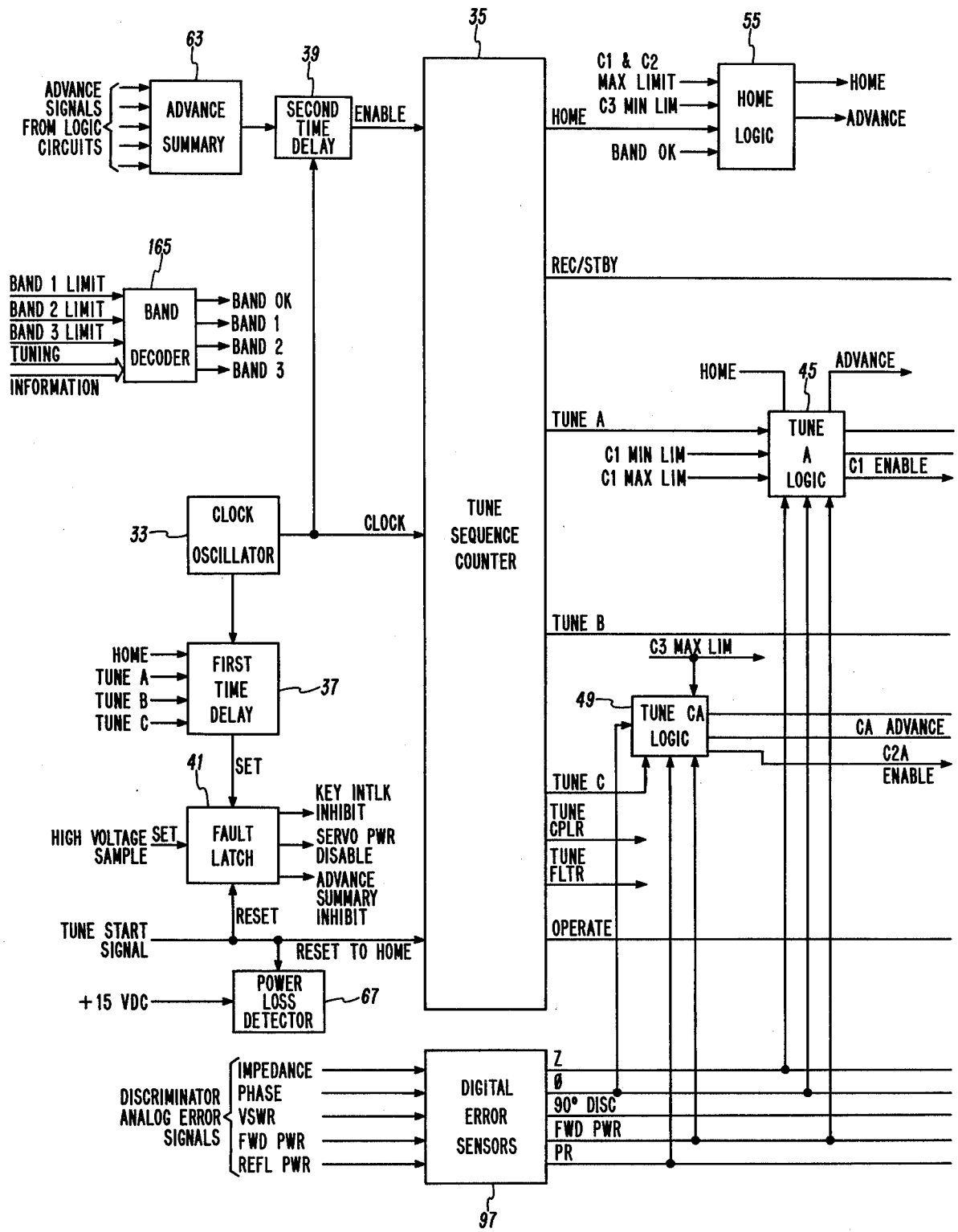
FIGS. 5a and 5b is a block diagram of the control logic assembly used to tune the tunable bandpass filter according to the invention.
Figure 5B:
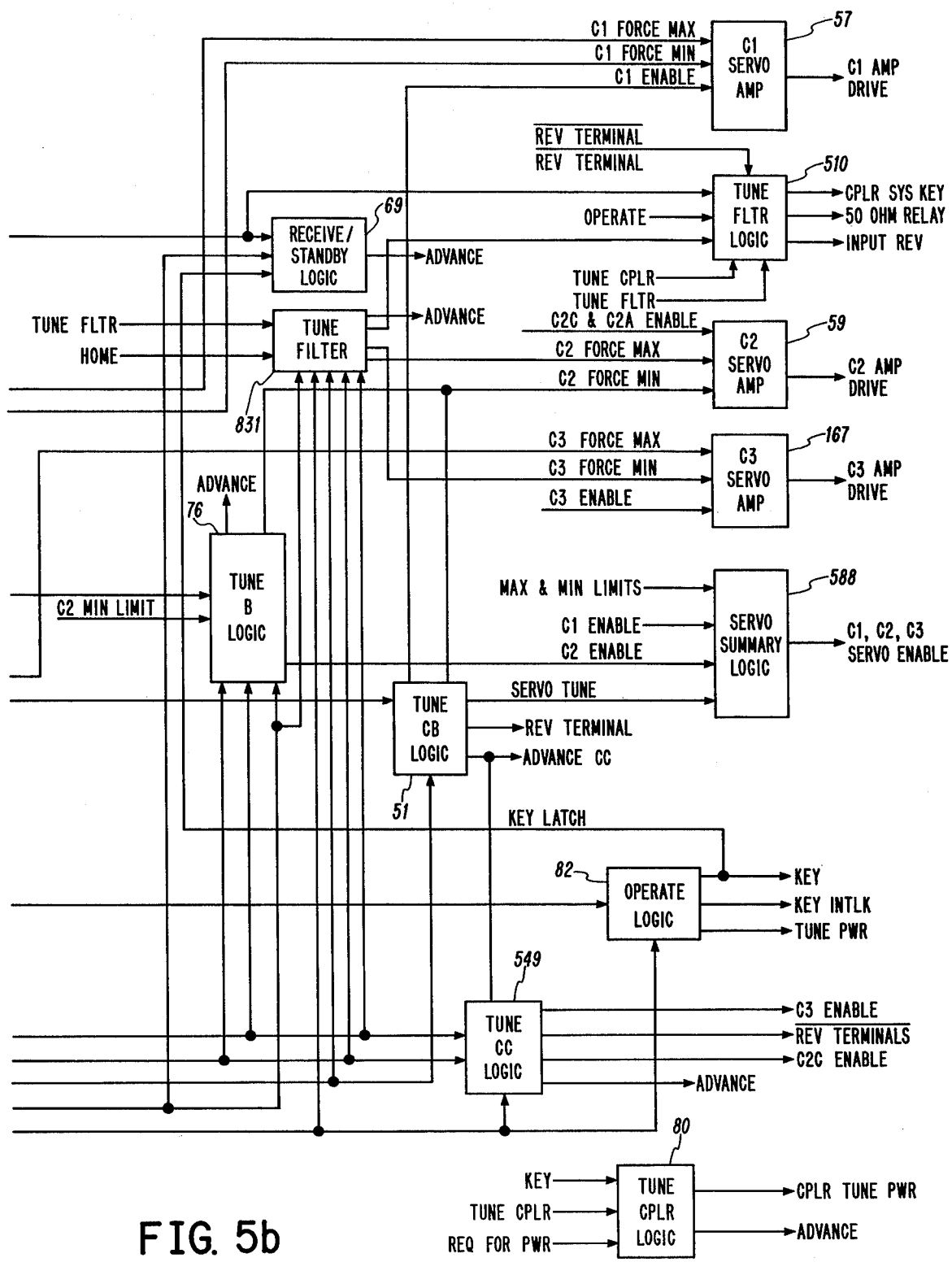

A functional block diagram of the logic and control assembly 17 is provided in FIG. 5, which is divided into two figures, 5A and 5B. Reference should now be made to both FIGS. 5A and 5B. A clock oscillator 33 produces a square wave clock signal that is used as a master timing clock for a tune sequence counter 35, a first time delay 37 and a second time delay 39. The first time delay 37 times the amount of time for the time sequence counter 35 to achieve a desired state. Amongst these states are the home state, receive/standby state, tune A state, tune B state, tune C state, tune coupler state, tune filter state, and operate state. If the first time delay 37 times out prior to one of the eight desired states being achieved then a fault latch 41 is set indicating there is a fault in the operation of either the logic control assembly 17 or the tunable bandpass filter 19. The fault latch, upon being set, inhibits the key interlock circuit which inhibits transmission of data and disables the servos which are used to tune the tunable bandpass filter 19. The tune sequence counter 35 is also inhibited by the fault latch 41. The fault latch is reset when a tune start signal is received from the transceiver 5 and the tune sequence counter 35 returns to the home state.

The home state forces the tunable bandpass filter 19 to a known state. Digital error sensors 97 receive analog signals from the HF discriminator 21 and the reflected power discriminator 15 that represents impedance, phase, forward power, and reflected power. These signals are compared to an internal reference signal within the digital error sensors and depending on the results of the comparison, the digital error sensors 43 will provide either a logic zero or a logic one indication of the appropriate conditions. These conditions are in the preferred embodiment; the digital representation of phase is detected by the HF discriminator 21 and represented by plus (+) or minus (−). + is equal to a logic 1 only when there is an inductive component measure and − is equal to a logic 1 only when there is a capacitive component. The impedance is represented as $\pm Z$, with $+Z$ being a logic 1 only when the measured impedance is greater than 50 ohms and $-Z$ being a logic 1 only when the measured impedance is less than 50 ohms. There are two other digitized signals from the HF discriminator 21. These include the voltage standing ratio signal, which is represented by PR low. PR low is a logic 1 only when the voltage standing ratio is less than or equal to 1.3. Additionally, the forward power that is provided from the HF discriminator 21 is represented as PF, which is a logic 1 only when the forward power is greater than 20 watts. The 90° discriminator output is digitized into two logic signals, a greater than 90° signal, GT90 and a less than 90° signal LT90. These signals are logic 1's when the phase difference as detected by the 90° discriminators is greater than 90° or less than 90°, respectively. The output from the reflected power discriminator is used to provide the enable signal as will be illustrated in conjunction with FIG. 14 and is primarily a logic 1 when the reflected power, as indicated in VSWR, is less than or equal to 1.3. These digital representations are used in the tune logic circuits to tune the tunable bandpass filter 19.

As was indicated earlier, the time sequence counter 35 generates essentially eight states: home, receive/standby, tune A, tune B, tune C, tune coupler, tune filter and operate. When a tune start signal is received the tune sequence counter 35 is reset to the home state. Additionally, enabling the antenna coupler 5 of FIG. 1 will also cause the tune sequence counter 35 to return to the home state. At the home state, the home logic circuit 55 is enabled and forces the tunable bandpass filter 19 to a known state which in the preferred embodiments of the tunable bandpass filter is to force the input capacitor C1, and the output capacitor C2 to their maximum capacitance value and the coupling capacitor C3 to its minimum capacitance value. A Band decoder 165 also based upon the band limits and tuning information, provides a band OK to the home logic circuit 55. Upon receipt of the home signal by the C1 servo amplifier 57, the C2 servo amplifier 59, and C3 servo amplifier 167 the capacitors C1 and C2 are forced to the maximum capacitance value and C3 is forced to its minimum capacitance value. When this step of the tuning is complete as indicated by the C1, C2 and C3 limit indications and the band OK indication, the home logic circuit 55 provides an advanced command signal to the advanced summary circuit 63 which activates the second time delay circuit 39. At the expiration of the second time delay as established by the second time delay circuit 39 the tune sequence counter 35 advances to the receiver/standby state.

The receive/standby state is a steady state or a rest condition of the tuning process. The radio signal elements of the tunable bandpass filter 19 are bypassed through the actions of the relays contained within the transfer relay mechanism 13. The receive/standby state allows the transceiver 5 to receive information that is picked up by the antenna 3 without passing the detected signal through the tunable bandpass filter 19. This is required because it is undesirable to have an unknown filtering element connected between the transceiver 5 and the antenna 3 which may filter out the received signals, therefore, the received/standby state is essentially a listening state without the tunable bandpass filter 19 and the HF discriminator 21 being connected in the circuit. Upon receipt of a key signal from the transceiver 5 and forward power being detected by the digital error sensors 43, the receive/standby logic circuit provides a second advance command signal to the advanced summary circuit 63. The advanced summary circuit 63 once again activates the second time delay circuit 39. At the expiration of the second time delay the tune sequence counter advances to the tune A state.

The tune A logic 45 receives forward power (fwd pwr), phase ($\phi$) and impedance (Z) logic signals from the digital error sensors 97 and also the input capacitor C1 maximum and minimum limits. When the phase signal ($\phi$) is positive or the impedance signal (Z) is negative an output signal is provided to the input capacitor C1 servo amplifier. Input capacitor C1 is forced toward minimum capacitance. When the phase signal ($\phi$) is negative and the impedance signal (Z) is positive, or the first time delay circuit 37 which was initiated at the beginning of the tune A state has timed out a third advance command signal is routed from the tune A logic 45 to the advanced summary circuit 63. After the timing out of the second time delay circuit 39, the tune sequence counter advances to the tune B state.

The tune B logic 76 receives forward power (fwd pwr) and phase ($\phi$) information in the form of logic signals from the digital error sensors 97. When the phase signal ($\phi$) is positive, an output signal is provided to the output capacitor C2 servo amplifier 59. Output capacitor C2 is forced towards minimum capacitance. When the phase signal ($\phi$) is negative or the first time delay circuit 37 which was reinitiated at the beginning of the tune B state has timed out, a third advance signal is routed from the tune C logic circuit to the advanced summary circuit 63. The second time delay circuit 39 is activated and upon its expiration the tune sequence counter 35 is advanced to the tune C state. It should be noted that negative phase indicates a capacitive component and positive phase indicates an inductive component. Negative impedance indicates less than 50 ohms and positive impedance indicates more than 50 ohms.

The tune C state is a three logic state, tune CA logic state, tune CB logic state and tune CC logic state. The tune CA logic 49 receives forward power (fwd pwr), phase ($\phi$) and impedance (Z) logic signals from the digital error sensors 97. C3 is forced toward maximum until the phase signal ($\phi$) is not positive as indicated by the PR low signal. When this occurs, the logic advances to the tune CB step. The tune CB logic 51 receives phase, ($\phi$), forward power (fwd pwr), and reflected power (PR) logic signals from the digital error sensors 97. The key interlock (key intlk) is removed, the input and output to the tunable bandpass filter 19 are reversed and the substitute load S3 is connected to the input of the tunable bandpass filter 19. After the expiration of a preset tune delay within the tune CB logic 51, the input capacitor C1 is tuned for a 90° phase indication by the phase signal ($\phi$). At the expiration of the second preselected time period, the tune CC logic 549 is energized. The relay transfer mechanism 13 reconnects the tunable bandpass filter 19 to the operate position. The output capacitor C2 and the coupling capacitor C3 are tuned until reflected power ((PR) low) is low, a negative phase signal is detected along with a less than 90° indication, or a negative impedance with greater than 90° phase relationship is detected across the tunable bandpass filter 19. When the tunable bandpass filter achieves any one of the above listed tuning conditions an advance signal is provided the advanced summary logic 63 and after the expiration of the second time delay the tune sequence circuit 35 advances to the tune coupler state (tune cplr). The tune coupler logic 80 provides a key signal to the antenna coupler 9 and will allow the antenna coupler 9 to tune until the request for tune power (req for pwr) is removed. After the second time delay responds to the advance signal provided by the tune coupler logic 80 the time sequence counter advances to the tune filter state.

The tune filter state provides for final tuning of the tunable bandpass filter 19 by adjusting the output capacitor C2 and the coupling capacitor C3 to meet the tuning conditions originally established in the tune CC state. These tuning conditions of the tunable bandpass filter 19 being affected by the load impedance may have been altered by the tuning of the antenna coupler 9. The tune sequence counter 35 at the completion of this state then advances to the operate state and the key signal is enabled by the operate logic 82 so that the transceiver 5 may begin to transmit information.

FIGS. 6 through 17 are schematic diagrams of the bandpass filter 7 of FIG. 1. The signals may be followed through the Figures by following the convention that a number in parenthesis adjacent a signal on the left side of the drawing represents the Figure number of the origin of the signal, and a number in parenthesis adjacent a signal on the right side of the drawing represents the Figure number to which the signal is going.

Figure 6:
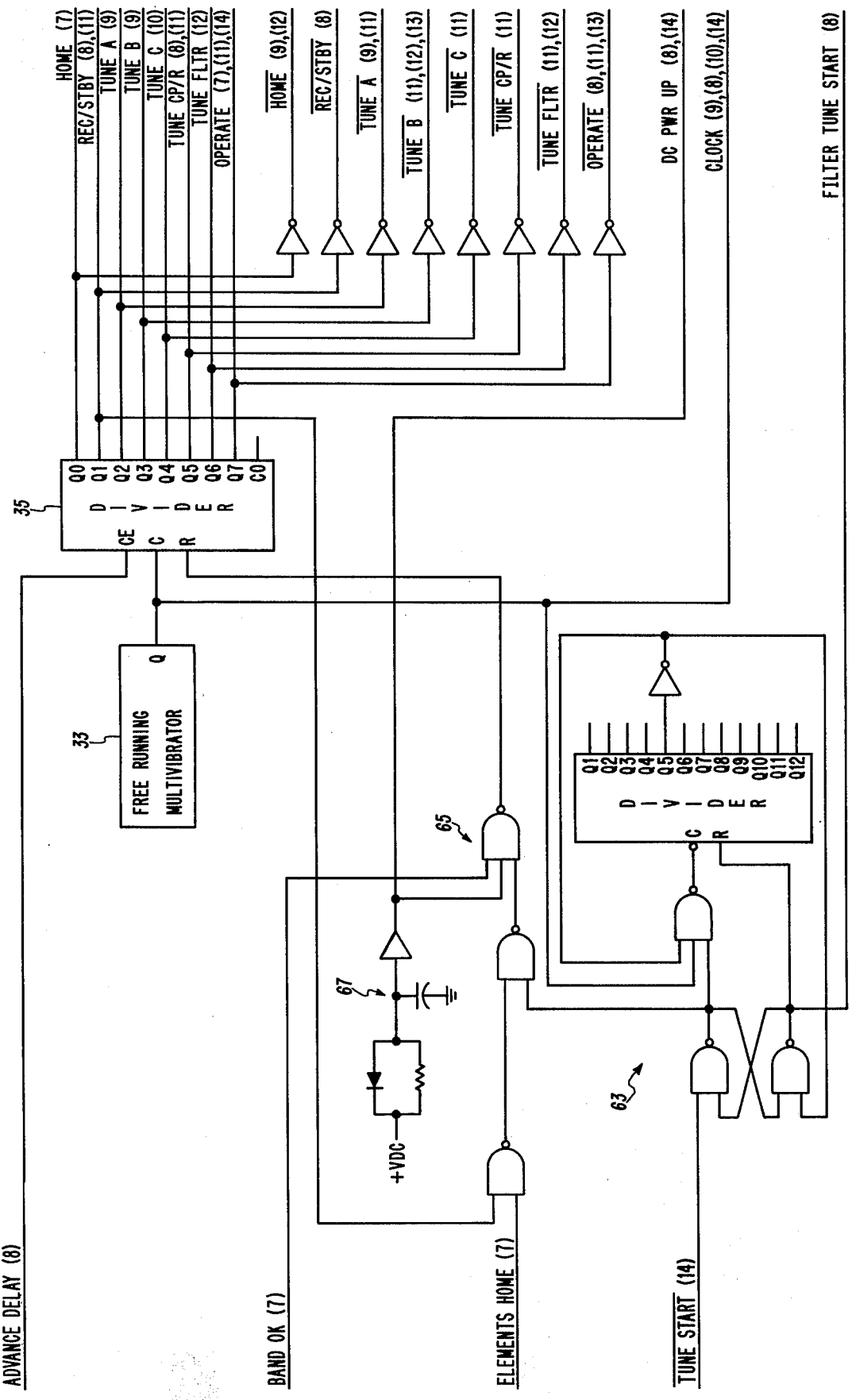

Referring to FIG. 6, which is part of the logic control assembly 17, the tune sequence is initiated when the tune start command is received by a pulse shaper circuit 63 from the transceiver 5 of FIG. 1. Circuit 65 resets the tune sequence counter 35 upon initial powerup, receipt of a band O.K. signal or an elements home command. When the tune sequence counter 35, which in the case of FIG. 6 is a divider, receives a reset command it returns to the home state. A free running multivibrator 33 provides clock pulses to the tune sequence counter 35 which if the advance delay signal is present from FIG. 8 will be enabled so that a clock pulse from the free running multivibrator 33 may advance the tune sequence counter to the different states.

Figure 7:
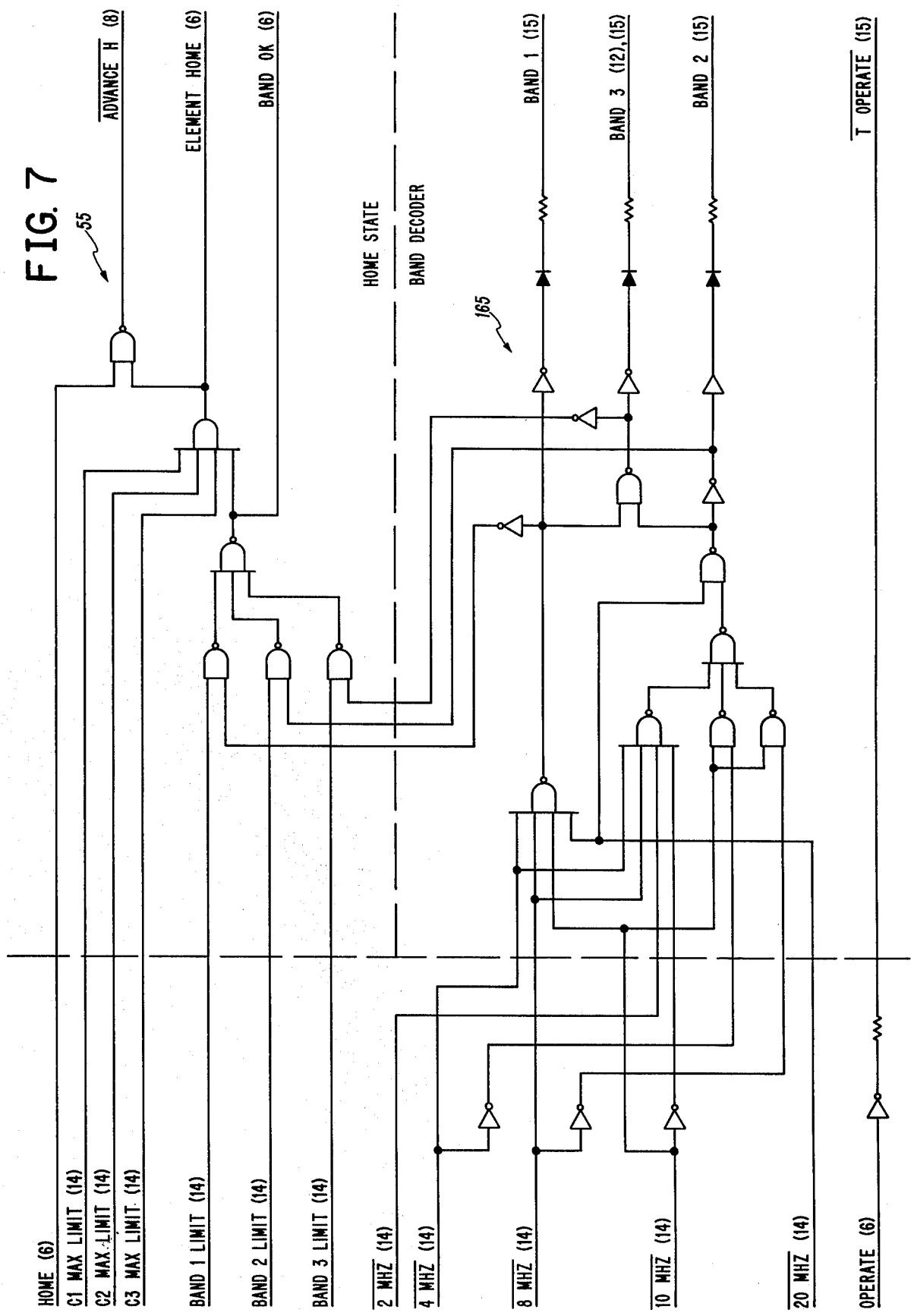

FIG. 7, to which reference should now be made, is a schematic diagram of the home state logic 55 as well as a band decoder circuit 165. The transceiver 5 provides the logic control assembly 17 with frequency information. The frequency information is provided in the form of weighted digital signals which are buffered by line receivers in FIG. 14 and forwarded to a band decoder circuit 165. The band decoder circuit 165 decodes the appropriate tuning information into one of three frequency bands and passes the frequency band to the line driver circuits shown on FIG. 15 to band selectors in the tunable bandpass filter 19 and for tuning the tunable bandpass filter to the desired band as well as to the home state logic 55. The home state logic 55 compares the decoded band with the status of the band limits which are provided from the tunable bandpass filter 19 with the decoded band from the band decoder 165 and will indicate by the band O.K. signal that the selected band as indicated by the band limit signals is in agreement with the decoded band. Additionally, in the home state, as was discussed in conjunction with FIG. 5, the logic control assembly 17 with the element home signal drives the input capacitor C1, the output capacitor C2 and the coupling capacitor C3 to a known capacitance value which in the case of FIG. 7 is the maximum limits for the input capacitor C1 and the output capacitor C2 and minimum limit for the coupling capacitor C3. Consequently, the logic in FIG. 7 senses when the input capacitor C1, the output capacitor C2 and coupling capacitor C3 are at these limits. Each limit is detected by limit switches in the tunable bandpass filter 19 and passed to the line receiver logic contained in FIG. 14 and then to the home state logic 55. When the indication of C1 max limit, C2 max limit and C3 min limit are obtained and the tune sequence counter 35 is in the home state then the advance signal is passed to FIG. 8, to which reference should now be made.

Figure 8:
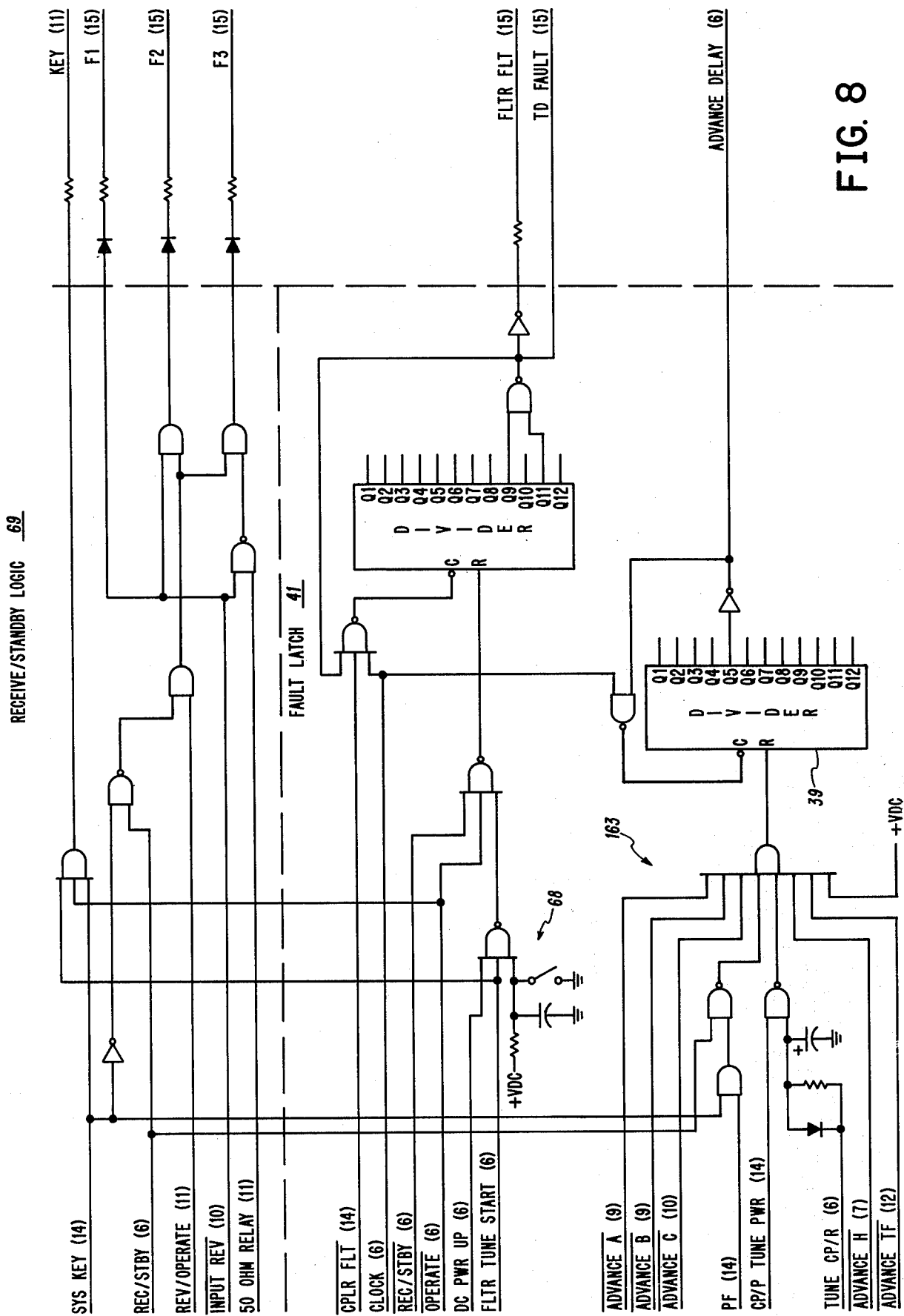

The advance summary 163 utilizes a multiple input AND-gate and by using the compliment of the advanced status can remove the reset from the time delay 39 which is implemented by a divider that divides down the clock pulse provided by the free running multivibrator 33. When the Advance A signal is received from the home logic 55 the second advance delay signal after the expiration of the second time delay is applied to the tune sequence counter 35 to advance to the next state. The next state, of course, is the receive/standby state (REC/STBY) in which case the receive/standby logic 69 decodes the necessary commands to insure the proper connection of the broadband filter in the circuit. In the receive/standby state the relays are energized such that the filter is bypassed. There are three decoded signals denoted F1, F2, and F3 that are passed to the line driver card in FIG. 16 for interfacing to the relay transfer mechanism 13 of FIG. 2. If at the expiration of the time that is decoded by the fault latch 41, as shown in FIG. 8, there is a filter fault, then the fault latch will indicate a fault. If the antenna coupler 9 does not complete it's tuning sequence in the allotted time provided by the clock divider the fault latch will stay latched until reset by a filter tune start command, manually by the switch 68 or on the DC power up command. The fault latch is only enabled when the sequence counter is in the operate state or the receive/standby state.

Figure 9:
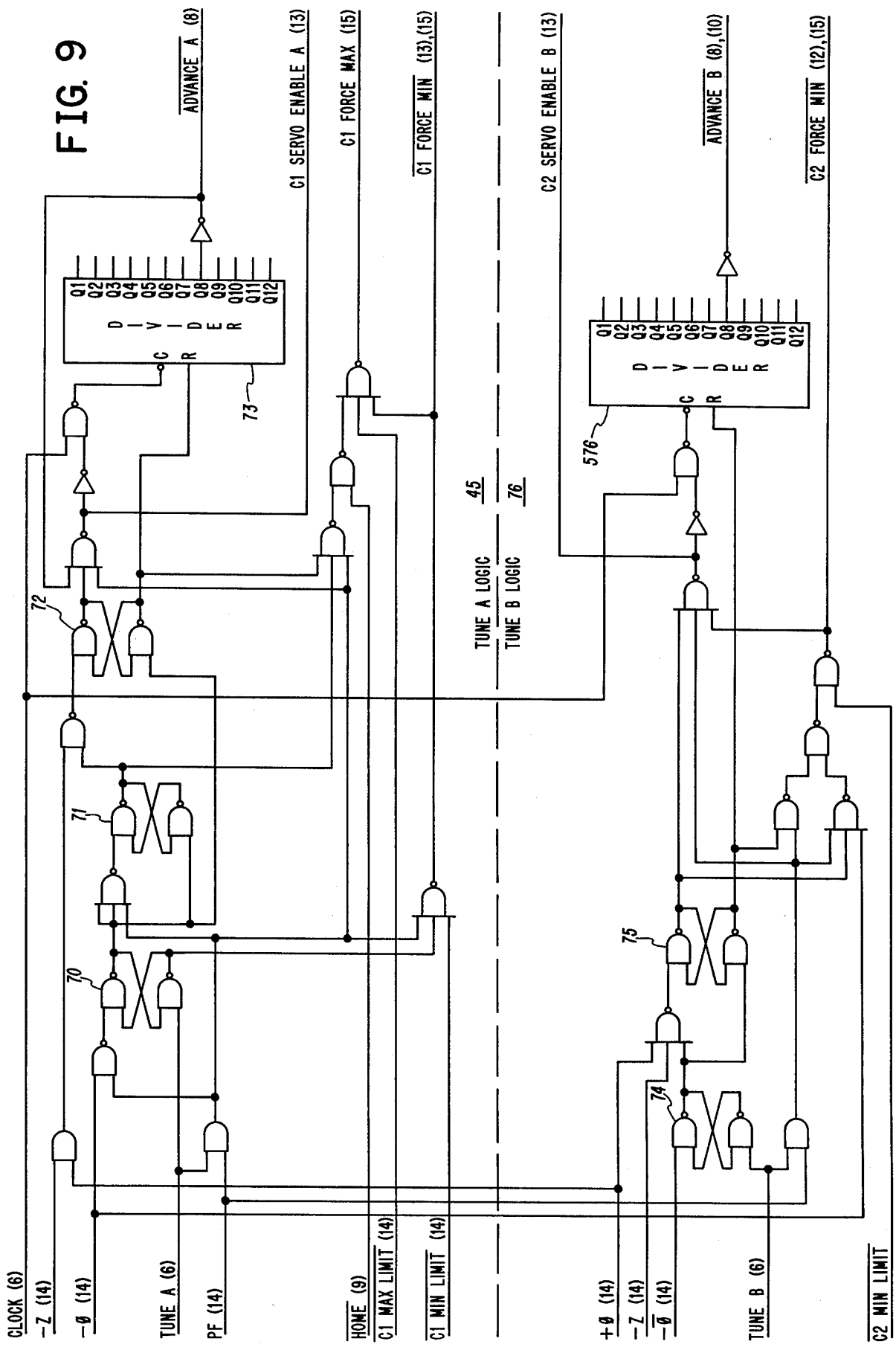

The next state is the tune A state, the logic for which is disclosed in FIG. 9 to which reference should now be made. Recalling from the discussions in conjunction with FIG. 5 that in the tune A state the tune A logic 45 receives forward power that is designated PF, phase that is designated $\phi$, and impedance that is designated Z, logic signals from the digital error sensors 97. This information is provided from the line receivers illustrated in FIG. 14. When the phase signal, $\phi$, is logic on, then the latch 70 is set causing latch 71 to be set and latch 72 to be reset. The C1 servo amplifier is enabled by the C1 servo enable A signal that is conveyed to FIG. 15 for driving the C1 servo amplifier which is contained in the tunable bandpass filter 19. Additionally, the reset of latch 72 ensures that the C1 forced max signal is a logic 0 and the C1 forced min signal, due to the setting of latch 70, is a logic 1. The input capacitor C1 in the tunable bandpass filter 19 is thus driven towards its minimum capacitance value until the $-\phi$ is detected. The tune A logic 49 then adjusts the input capacitor C1 for a $-Z$ logic signal or until the divider 73 provides the advance A signal at the expiration of the time delay. The input capacitor C1 is driven until either the C1 minimum limit is reached or until the phase signal, $-\phi$, is a logic 1 and the minus impedance, $-Z$, is logic 1 at which time the divider 73 is enabled and generates the advance A signal which is applied to the advanced summary logic 63 that is disclosed in FIG. 8. At the expiration of the second time delay 39 the tune sequence counter 35 advances to the tune B state the logic of which is also provided in FIG. 9.

The tune B logic 76 receives the forward power (PF), phase $+\phi$ and $-\phi$, and minus impedance, $-Z$, logic signals from the digital error sensors 43. When the phase signal, $+\phi$, is positive, latch 75 is set causing the C2 servo enable signal to be provided to the C2 servo amplifier contained within the tunable bandpass filter 19. Output capacitor C2 is then forced by the C2 forced min signal to its minimum capacitance value. When the phase signal, as indicated by $-\phi$ or $+\phi$, is negative and the minus impedance signal, $-Z$, is logic 1 the divider 576 is enabled and divides the clock pulses to provide an advance B signal to the advance summary 63 that is contained on FIG. 8 to advance the tune sequence counter 35 to the tune C state.

Figure 10:
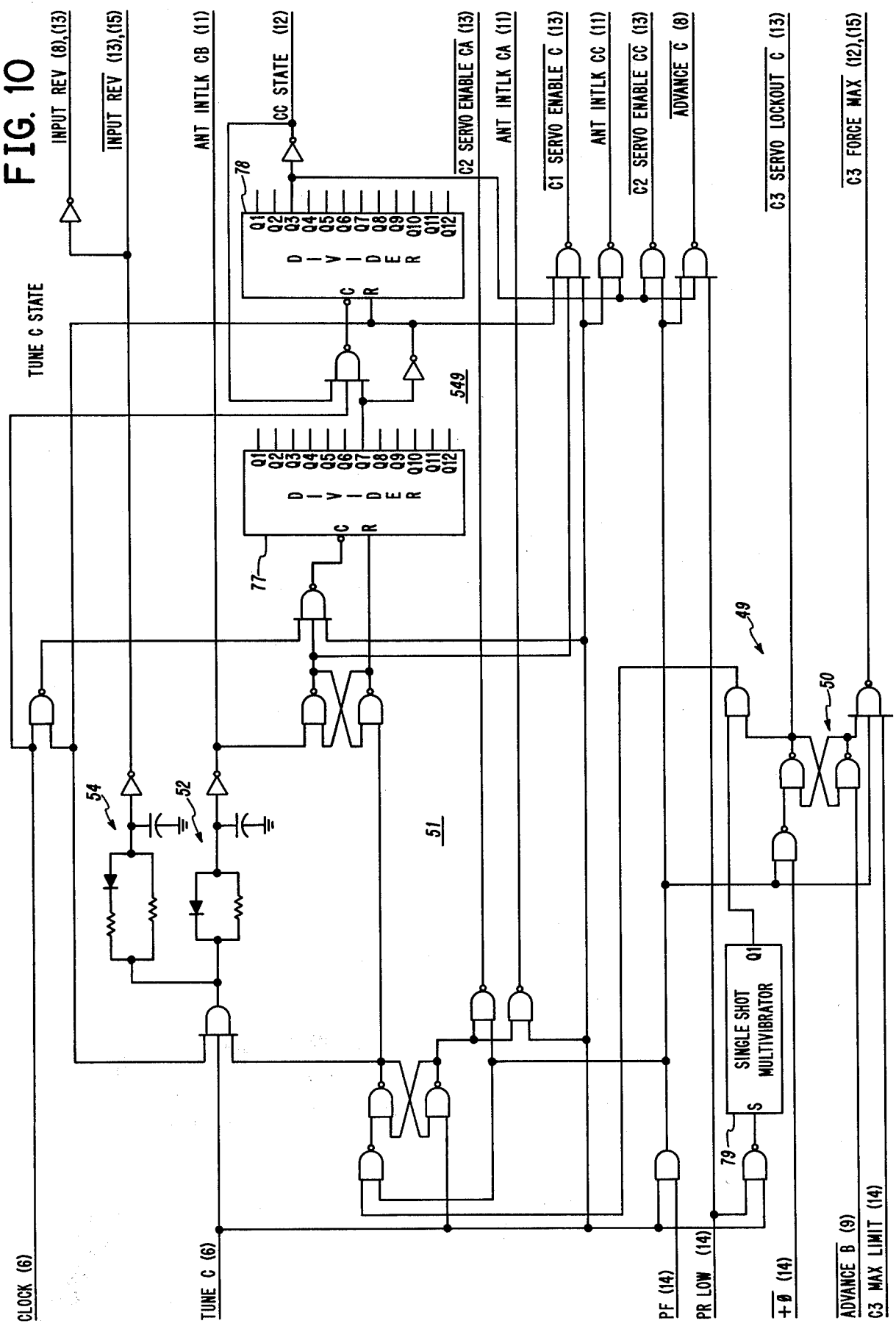

FIG. 10 is a schematic diagram of the tune C logic that includes both the tune CA logic 49, the tune CB logic 51 and the tune CC logic 549. Upon the receipt of the tune C command from the tune sequence counter 35 of FIG. 6 the coupling capacitor C3 is forced toward maximum by the setting of the latch 50. The coupling capacitor C3 is forced towards its maximum capacitance value until a $+\phi$ logic signal is detected. Simultaneous with the tuning of C3 the output capacitor C2 is enabled to tune for Z until the reflector power low (RP low) logic signal is detected. At the completion of the tune CA state the antenna interlock signal (Ant Intlk CB) is removed after the expiration of the time delay that is provided by the pulse delay circuit 52. This delay turns off the rf power to provide time for switching the relays in the transfer relay assembly. Additionally, the reversal of the connections of the tunable bandpass filter 19 is implemented by the input Rev signal (tune CB state) that is delayed by the pulse delay circuit 54 to facilitate the further positioning of the coupling capacitor C2. After the time delay that is provided by the divider 77 the input capacitor C1 is tuned for a 90° phase relationship between the signal on the output terminal and the signal on the input terminal of tunable bandpass filter 19. At the expiration of the time delay that is provided by the divider 77 the antenna interlock signal (Ant Intlk CB) is removed and the input reverse signal is also removed. The tunable bandpass filter 19 is reconnected in the operate position. The time for performing these functions is provided by the divider 77. At the expiration of the time delay provided by the divider 77 an output pulse is provided to the divider 78 to implement the tuning of the tune CC state. The tune CC logic 549 receives phase information ($+\phi$), forward power, (PF), and VSWR (PR low) logic signals from the digital error sensors. The output of the tune CC logic circuits 549 allows the output capacitor C2 within the tunable bandpass filter 19 to be tuned by both phase $+\theta$, and impedance (Z) error signals. Output capacitor C2 is tuned towards minimum by the C2 servo enable CC signal until the phase and impedance signals change. Then, servo tuning of the coupling capacitor C3 is enabled. When a PR low signal is detected a one second time delay is implemented by the single shot multivibrator 79 to provide additional tuning of the output capacitor C2. At the expiration of the divider 78, the advance CC signal is provided to the advanced summary which energizes the second time delay 39. At the expiration of the second time delay 39, the divider 35 advances to the next state which is as indicated in FIG. 6 the tune coupler state. The antenna coupler 9 is tuned during this state and is primarily tuned to ensure an impedance match between the antenna 3 and the output impedance of the bandpass filter 7.

Figure 11:
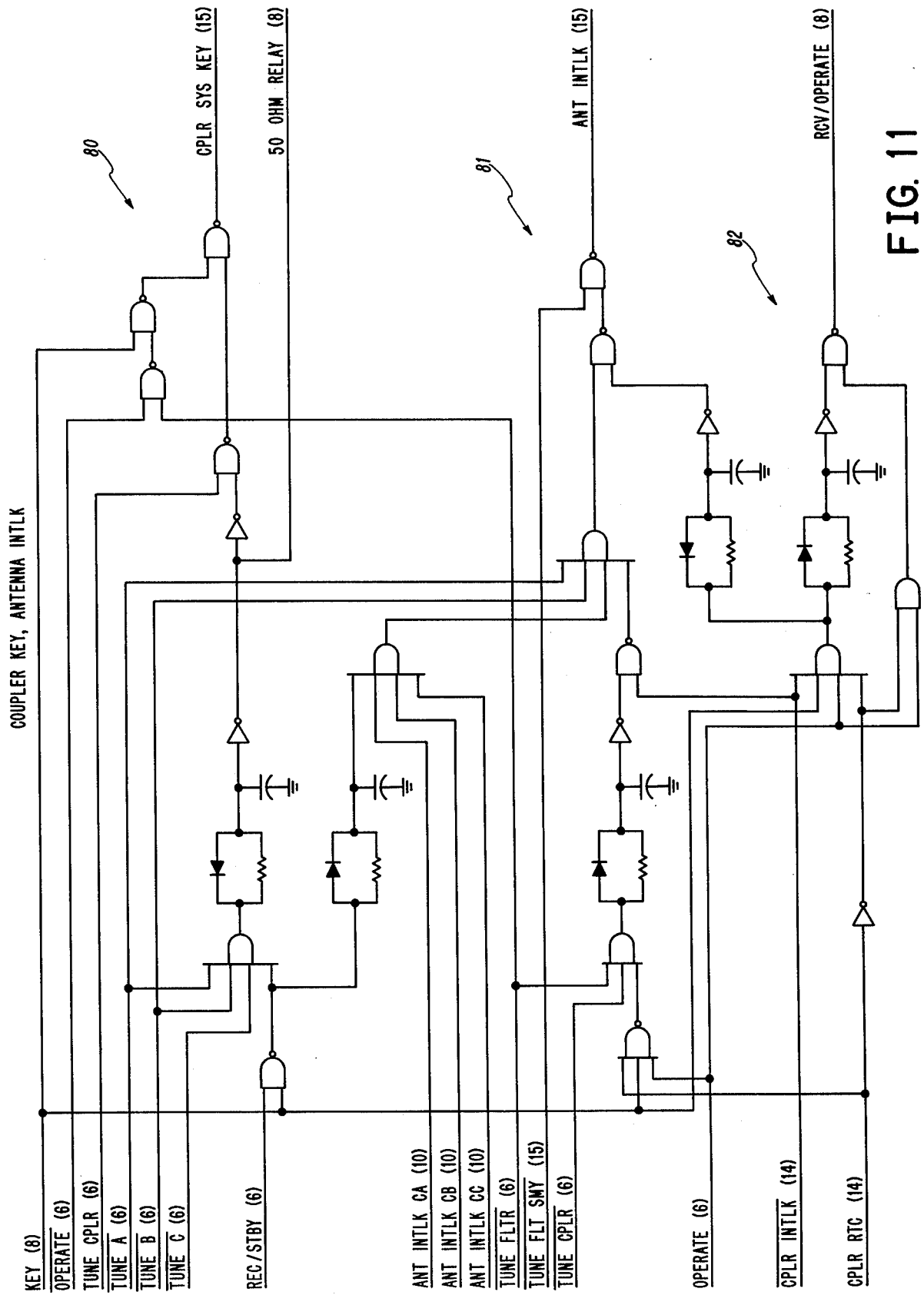

FIG. 11 facilitates the tuning of the antenna coupler and provides the coupler system keying at the completion of the tune CC function. However, during the period of time that the tunable bandpass filter is being tuned, the coupler system key is removed by the coupler key logic 80 and the antenna is disabled through the interlock circuits that is shown in the logic circuit 81. Additionally, FIG. 11 provides for generating the receive operate signal from the operate signal, the coupler interlock and the coupler RTC signals at logic 82. RTC means "receive thru coupler" as opposed to bypass coupler. There are time delays implemented by having RC time constants in the circuits for generating the antenna interlock, the receive operate and the 50 ohm relay signal. The 50 ohm relay, as was discussed in conjunction with FIG. 10, is used to activate the 50 ohm relay that connects the 50 ohm load that is contained within the bandpass filter 7 to the tunable bandpass filter 19.

Figure 12:
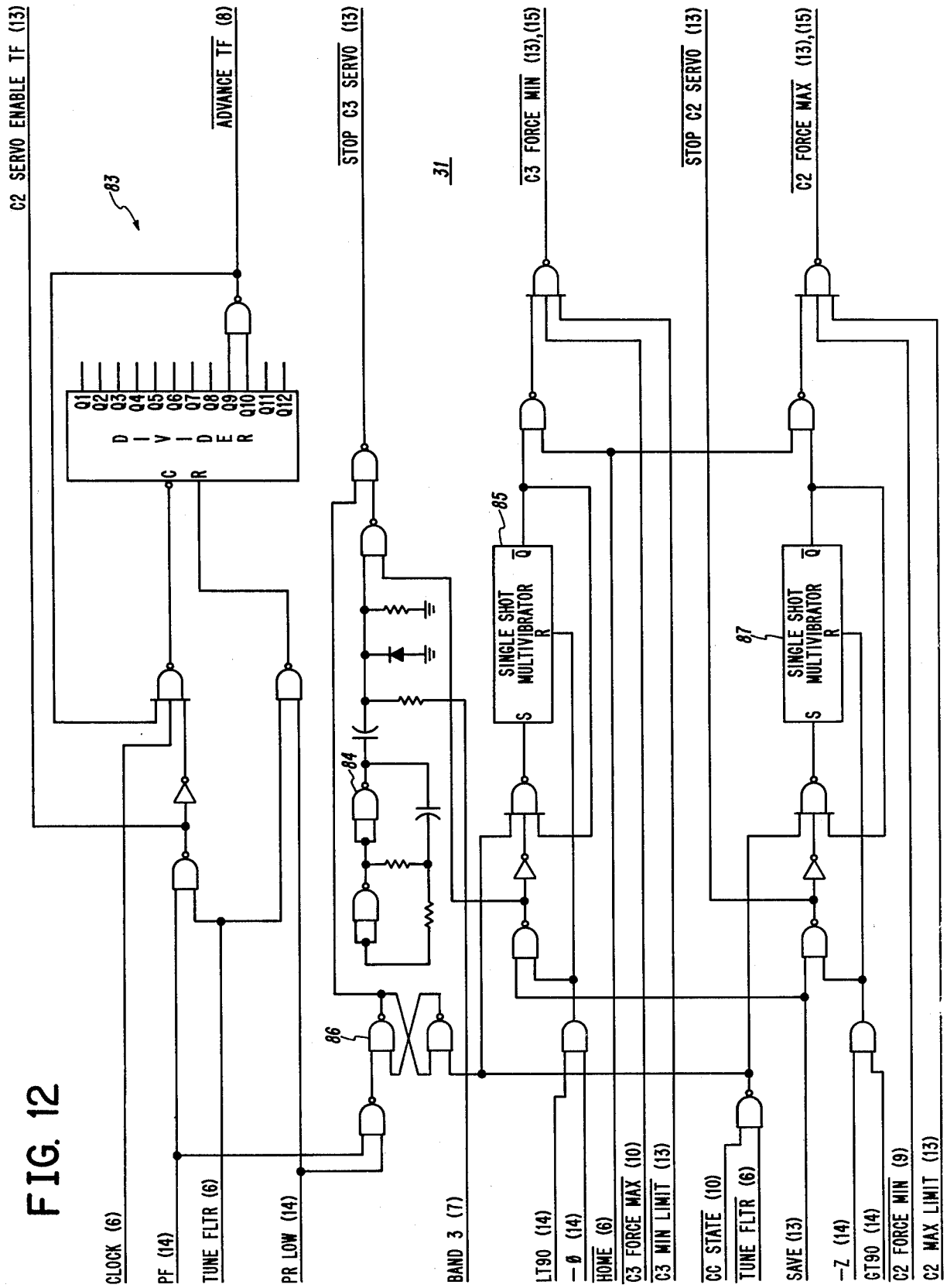

FIG. 12 is the tune filter logic 83 which controls the state in which capacitors C3 and C2 are fine tuned. When the tune sequence counter advances to the tune filter state, then the tunable bandpass filter 19 is adjusted. A tune filter command in conjunction with the forward power signal initiates a timer that is embodied within the divider 83 that divides the clock pulse from FIG. 6 to provide tuning time for the output capacitor C2. Simultaneously with the tuning of the output capacitor C2, the coupling capacitor C3 is forced towards a minimum position until the proper phase and logic signals are detected. The period of time that the coupling capacitor C3 is being forced to a minimum capacitance value is established by the local oscillator 84 providing clock pulses to single shot multivibrator 85 that will result in the C3 forced minimum signal being present for the period of time that the Q terminal is at a logic zero level. The C3 forced minimum signal will be inhibited however if the coupling capacitor C3 has reached its minimum limit and overridden if any of the following logic conditions are met:

$-\phi$.LT90 C3 min limit; or C3 force max. The local oscillator 84 also, after approximate time delay, stops the C3 servo by providing the stop C3 servo signal. The stop C3 signal is provided when the latch 86 is reset by going out of the tune filter state and also out of the CB state which was originated on FIG. 10.

The output capacitor C2 is tuned towards its maximum capacitive value by the C2 forced max signal which is present for the time period that is established by the single shot multivibrator 87. The single shot multivibrator is set by the stop C2 servo in conjunction with the tune filter command being present or the CC state signal being present. The single shot multivibrator 87 may be overridden when the 90° discriminator detects a phase relationship of greater than 90° and a minus impedance indicating that the forcing step is complete. Normally the output capacitor C2 and coupling capacitor C3 servos are enabled. If the stated conditions appear then one of the capacitors will stop to allow for the other elements to catch up before servo tuning again. Timer 83 indicates that the tuning is complete and causes the tune sequence counter to advance to the operate state after the appropriate time delay.

Figure 13:
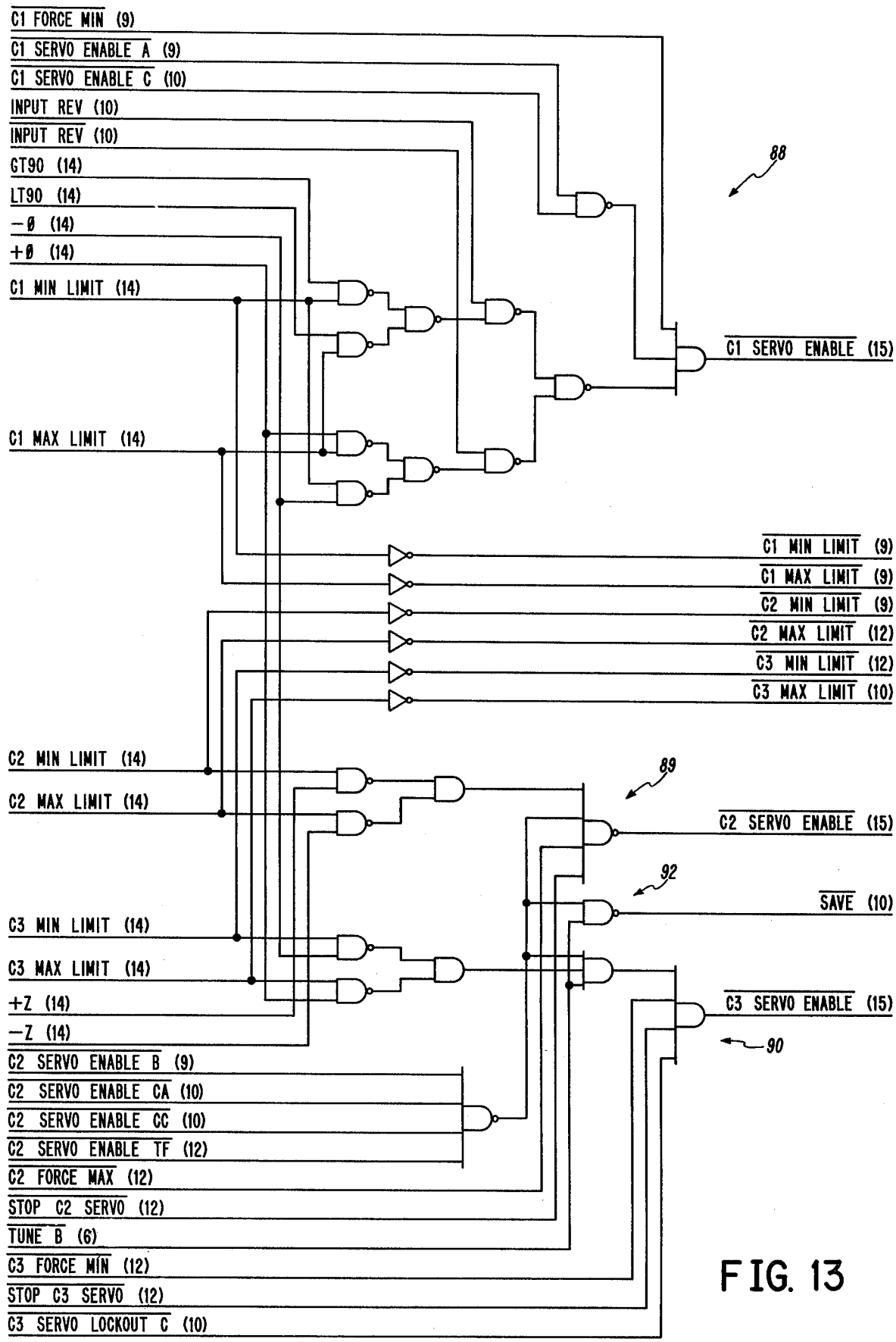

FIG. 13 is the servo summary logic 588 which combines the servo commands from different portions of the control logic into signals in response to which the servo amplifiers perform the tuning of the input capacitor C1, the output capacitor C2 and the coupling capacitor C3. Referring to FIG. 13, the C1 servo enable is generated by the logic 88 which combines C1 force min, C1 servo enable A, C1 servo enable C, both the input REV and the complement thereof, the greater than 90° signal (GT90), less than 90° signal (LT90), the $-\theta$ and the $+\theta$ phase signal to provide the servo enable to signal to FIG. 15 for transmitting to the servo contained within the tunable bandpass filter 19. The limits, C1 min limit and C1 max limits, prevent the servos from overtuning the C1 capacitor by causing the C1 servo enable to be removed. The C2 servo enable is generated by the impedance signal $+Z$, the $-Z$, the C2 servo enable B signal, the C2 servo enable CA signal, the C2 servo enable CB signal, the C2 servo enable TF signal and the C2 force max signal. The C2 servo enable signal, of course, is overridden by the C2 max limit signal and the C2 min limit signal and stopped by being either in the tune B state or receipt of the stop C2 servo signal. The logic for performing these functions is indicated at 89. Additionally, logic function 92 generates a save command which is used as part of the force catch up circuitry during the tune filter state. Logic 90 generates the C3 servo enable signal from the C2 servo enable B signal, C2 servo enable CA signal, C2 servo enable CC signal, C2 servo enable TF signal, as well as the tune B signal, by the presence of any of these signals along with the C3 min limit signal or the C3 max limit will prevent the C3 servo enable signal from being enabled. The absence of any of these conditions will enable the C3 servo by providing the C3 servo enable signal unless the C3 servo lockout C, the C3 force min signal or the stop C3 servo is present.

Figure 14:
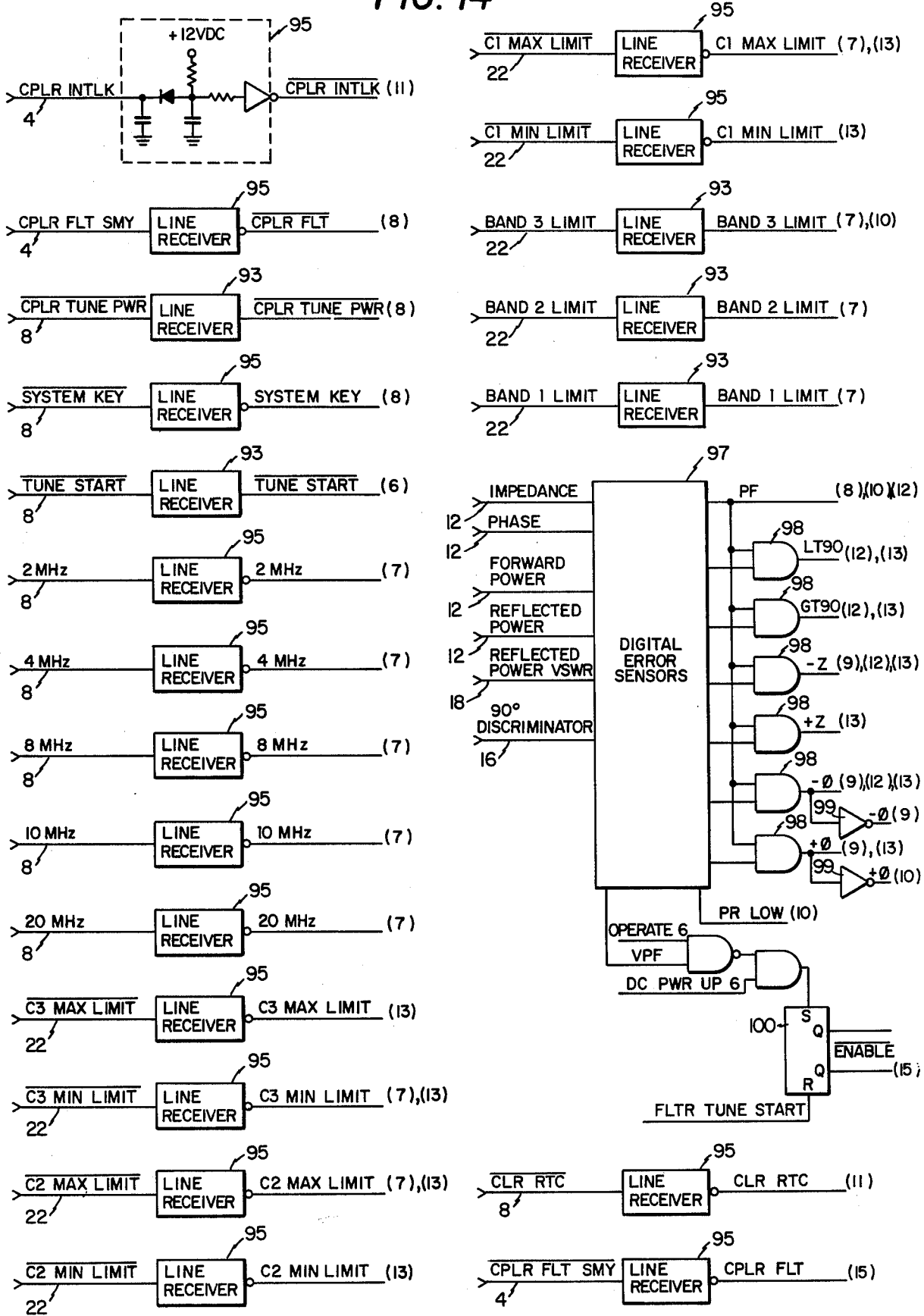
Figure 18:
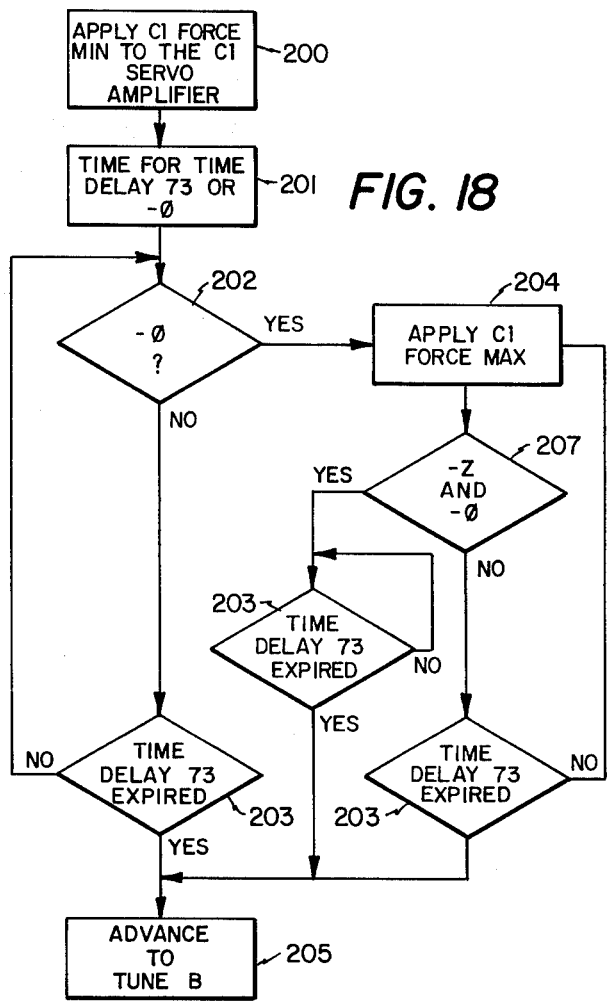

FIG. 14 is a schematic diagram of inverting line receivers 95 and noninverting line receivers 93 that are used to receive signals via the conductor bundle 8 from the transceiver 5, the conductor bundle 4 from the antenna coupler 9, conductor bundle 22 from the bandpass filter 19, conductor 16 from the 90° discriminator 23 of FIG. 2 and conductor 18 from the reflected power discriminator 15. The antenna coupler 9 provides a coupler interlock signal to the receivers 93 and 95 as well as a coupler fault summary. These signals are provided from the antenna coupler 9 which in the preferred embodiment is a Model No. HF-8040 antenna coupler manufactured by Rockwell International Corporation of Cedar Rapids, Iowa. The coupler is responsive to a coupler tune start signal, a coupler system key, a coupler interlock as well as a coupler tuned power signal which will be discussed in conjunction with FIG. 15. The transceiver 5 in the preferred embodiment is a Model No. HF-8014 and HF-8020 manufactured by Rockwell International Corporation; however it could be any unit that will provide a coupler tuned power signal, a system key signal, a tune start signal, a digital representation of the tuned frequency as well as the coupler RTC signal which is a strapping option in the interconnect cable. The tunable bandpass filter 19 provides to the logic control assembly 17 indications of the maximum tuning limits of the capacitors C1, C2 and C3 as well as the band limits of band 1, 2 and 3. The digital error sensor 97 accepts impedance, phase, forward power, and reflected power from the HF discriminator 21 via conductor bundle 12 and converts the analog signals that are provided by the HF discriminator 21 into binary logic states. Also converted into binary logic state is the reflected power from the reflected power discriminator 15 that is applied to the digital error sensor via conductor bundle 18 as well as the output of the 90° discriminator 23 that is provided by conductor 16 to the digital error sensor 71. The output of the digital error sensor 97 provides a PF signal which represents the logic state of the forward power and this is used to gate AND gates 98 which provides the less than 90°, LT90; the greater than 90° signal, GT90; the minus impedance signal, $-Z$; the plus impedance signal, $+Z$; the minus phase signal, $-\phi$; the plus phase signal, $+\phi$; which are also inverted by the inverting amplifiers 99 to provide a $-\theta$, and a $+\theta$. Additionally a low reflected power signal, PR low, is also provided as well as a VPF signal which is used to provide an enable signal from the latch 100.

Figure 15:
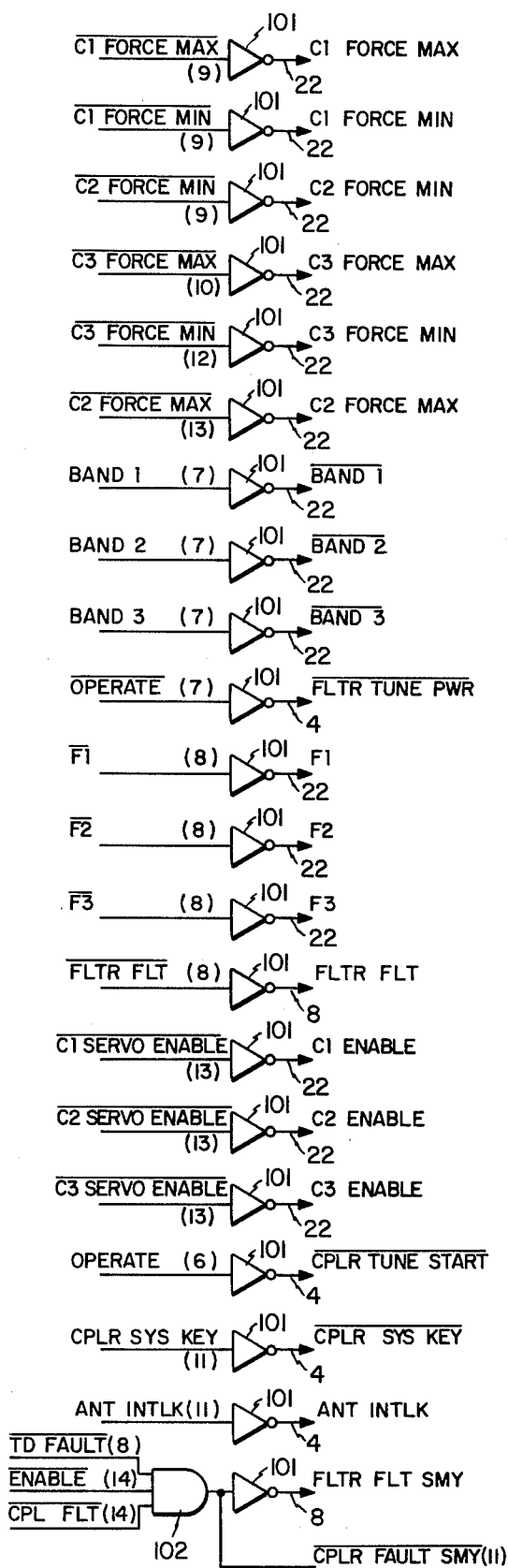

FIG. 15, to which reference should now be made, provides the line drivers that are used to interface the logic control assembly 17 to the antenna coupler 9, the transceiver 5 and the tunable bandpass filter 19. The signals that are provided on conductor bundle 22 are the four signals, both maximum and minimum, for the input capacitor C1, output capacitor C2 and the coupling capacitor C3; the band select signals for band 1, 2 and 3 for tuning the variable inductance that is contained within the tunable bandpass filter 19; the relay select lines F1, F2 and F3; and the enable signals for the servo amplifiers that are used to tune the input capacitor C1, output capacitor C2 and the coupling capacitor C3. Additionally, a filter fault summary is provided to the transceiver which is the combination of the enable signal, a coupler fault indication and a time delay fault which provides back to the transceiver an indication that there is a problem with either the coupler or the bandpass filter. The filter fault summary includes the AND gate 102 and the drive 101. The coupler is provided with a tune start signal, a system key and a coupler interlock system as well as a tune power signal.

FIG. 16 is a block diagram of the digital error sensors 97 in which each error sensor includes an input buffer 103, a bidirectional limiting amplifier 104 and a digital output amplifier 105. Each bidirectional amplifier 104, unless there is only one level conversion to digital signal required, includes two difference amplifiers 106A and 106B. Amplifier 106A accepts on its negative terminal the input signal from the input buffer 103 and obtains the difference between the input signal and a negative voltage reference that is connected to its positive terminal that is established by the negative DC voltage source and a voltage divider 107. The difference is amplified by the gain that is established with resistor 108 and the output is applied to a digital amplifier 105 by means of the blocking diode 109. The positive indication is connected to the output of the input buffer 103 by resistor 109 which joins the output of the input buffer 103 to the positive terminal of the difference amplifier 106B. A positive DC reference is established by a positive DC voltage (provided from a source not shown) and a resistor divider network 107. The amplifier 106B obtains the difference and amplifies the difference by the gain that is established by the feed-back resistor 108 as well as the input resistances and the amplified difference signal is applied to the logic amplifier 105 by means of the blocking diode 109. The forward power, reflected power and reflected power VSWR which is from the reflected power discriminator 15 only have a positive indication so consequently only amplifier 106B is utilized in the bidirectional amplifier 104.

Figure 17A:
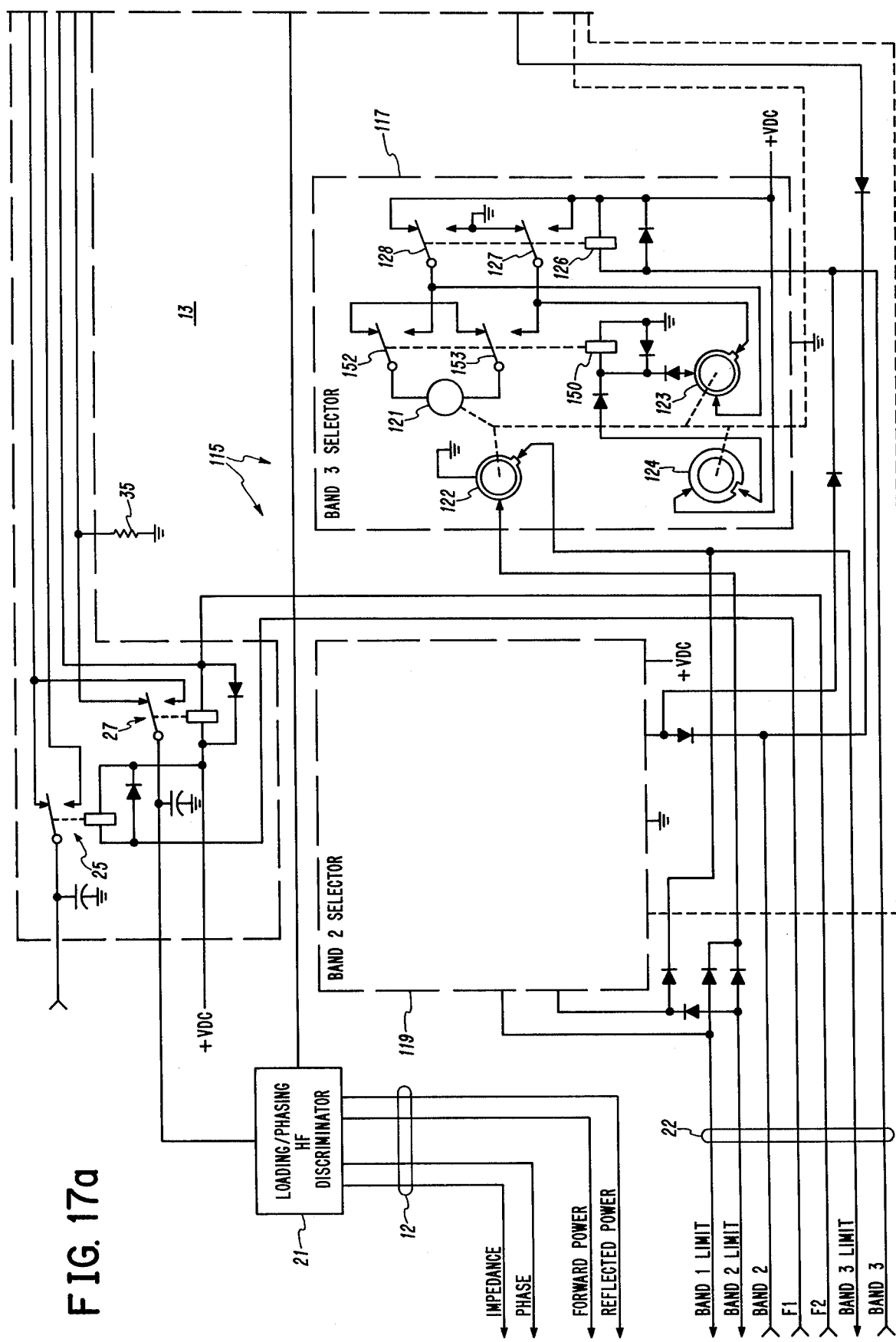
FIGS. 17a and 17b are schematic diagrams of the bandpass filter according to the invention.
Figure 17B:
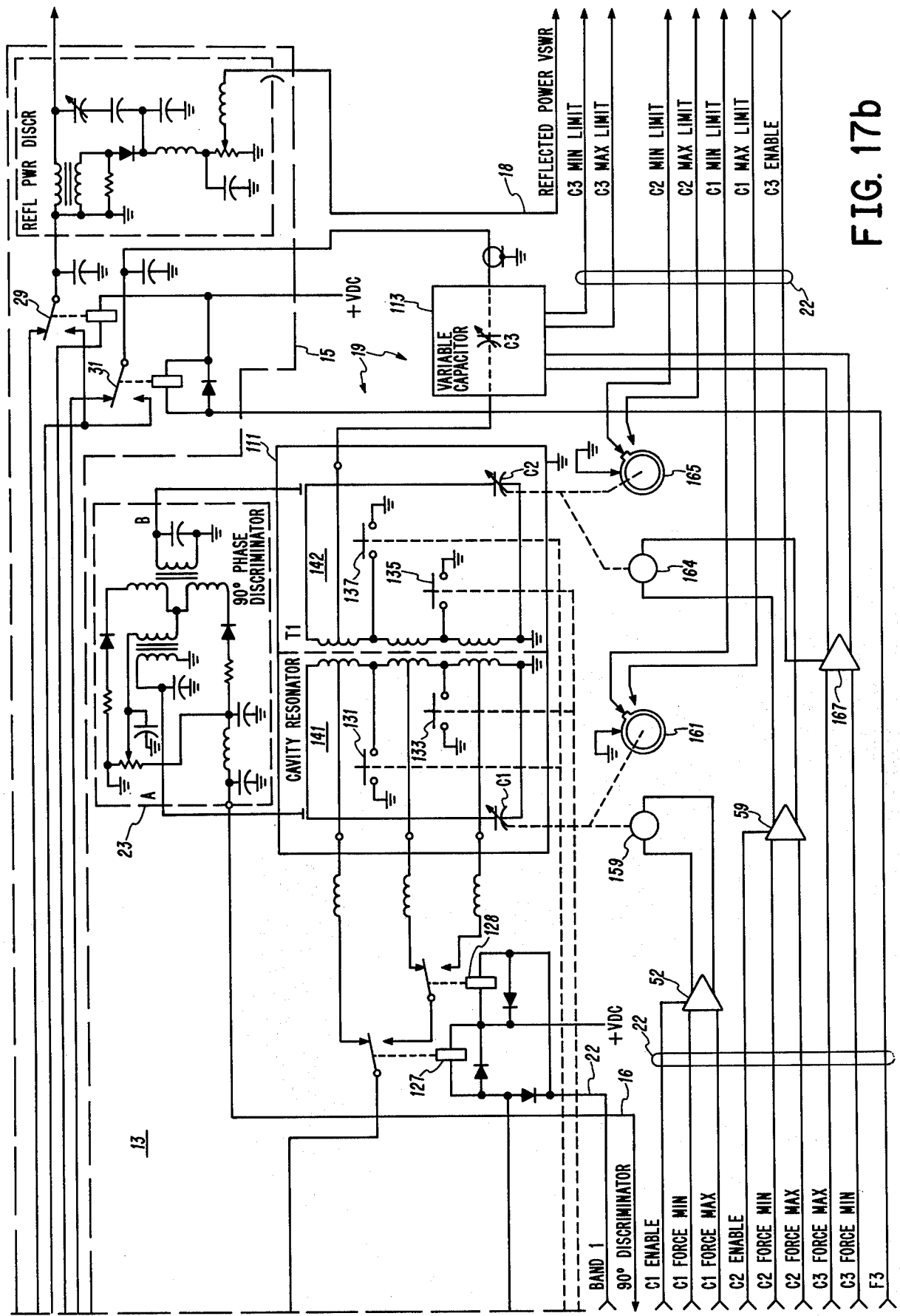
Figure 21:
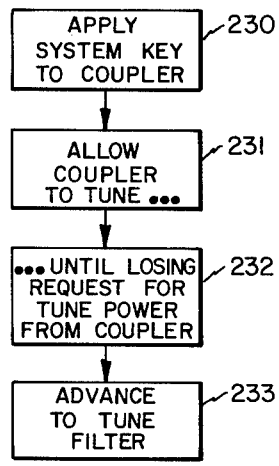

The tunable bandpass filter 7 is provided in FIGS. 17a and 17b which, for clarity, should be used in conjunction with FIG. 3. Signal F1 controls relay 25, F2 controls relay 27 and F3 controls both relay 29 and relay 30. Given those facts, there are essentially 3 states that are utilized by the bandpass filter 19. With F1, F2 and F3 at high logic states, relays 25, 27, 29 and 31 are connected so that the HF discriminator 21 and tunable bandpass filter 19 are bypassed and the tunable bandpass filter is not in the circuit. This circuit connection is encountered in the receive/standby state. The HF discriminator 21 and tunable bandpass filter 19 are connected in the circuit by energizing F2 and F3 causing relays 27, 29 and 31 to connect the signal from terminal 25A of relay 25 to the HF discriminator 21, the tunable bandpass filter 19 and to terminal 31C of relay 31 which is connected to terminal 29A of relay 29 thereby placing the HF discriminator 21 and the tunable bandpass filter 19 in the circuit. For a reverse connection, F1 goes to the logic zero state, or low logic level state, pulling in relay 25. F2 and F3 go to the high logic level state causing relays 27, 29 and 31 to deactivate. This signal path allows for the signal that is present on conductor 29A to be connected to terminal 31C of relay 31, pass through the tunable bandpass filter 19, the HF discriminator 21 to the terminal 27A, which is connected to terminal 27b and the load 3S. The HF discriminator 21 provides loading and phase information to the logic control assembly 17 and can be any of the known type of discriminators in the art that will detect impedance, phase, forward power and reflected power. The tunable bandpass filter 19 includes a cavity resonator 11 such as that disclosed in our co-pending U.S. Patent application Ser. No. 381,809 filed on even date herewith, by reference incorporated herein, and a variable capacitor 113. The cavity resonator has a variable transformer $T_1$ which is divided into two cavities, the primary being in the first cavity 141 and the secondary being in the second cavity 142. There are essentially three bands connected with the cavity resonator and consequently by shorting the primary winding and secondary windings of the transformer $T_1$ through the closing of contacts 131, 133, 135 and 137 the three bands of frequencies to which the tunable bandpass filter is applicable may be selected by tuning the resonance of the cavity resonators 141 and 142 to resonate at frequencies within the selected bands. Band 1 is selected by the relays 127 and 128 both being activated giving the highest inductance and consequently the lowest frequency band for the resonators to resonate in. Band 3 is selected by the band 3 signal going to the band 3 selector 117 which is a band selector switch. When band 3 is selected relay 126 energizes forcing the relay 150 to energizing providing power to the motor 121 via relay contacts 151 and 152. Limit switch 122 indicates when either the maximum limit or minimum limit is reached by the motor 121. Cam 124 will cause the relay 150 to be energized.

The band 2 selector 119 includes a band selector 115 which operates in the same functions as the band 3 selector 117. The turning of the motor 121 in both the band 2 selector 119 and the band 3 selector 117 causes the contacts 131, 133, 135 and 137 to be activated. Contacts 133 and 135 are controlled by the band 2 selector 119 and contacts 131 and 137 are controlled by the band 3 selector 117.

Input capacitor C1 is tuned by servo motor 159 which is driven by a servo amplifier 160. The servo amplifier receives the input capacitor C1 enable signal along with the C1 forced min signal and C1 forced max signal. The servo amplifier 57 causes the servo motor 195 to tune, varying the input capacitor C1. Limit switch 161 indicates when the input capacitor C1 has reached either its minimum limit or its maximum limit. Servo amplifier 59 drives the servo motor 164 which varies the capacitance of the output capacitor C2 and also drives the limit switch 165 which will indicate when the output capacitor C2 has reached either its maximum or minimum limit. The servo amplifier 59 is enabled by the C2 enable line. The degree of rotation that the servo motor 164 is driven is based upon the C2 forced min signal and the C2 forced max signal. Servo amplifier 167 drives a servo motor which is contained within the variable capacitor module 113 and is enabled by the C3 enable signal. The degree to which the coupling capacitor C3 is tuned is based upon the signals C3 forced max and C3 forced min. The output capacitor C3 that is contained within the variable capacitor module 113 includes a servo motor and a limit switch and provides an indication when C3 has reached its maximum or minimum limits.

Figure 19:
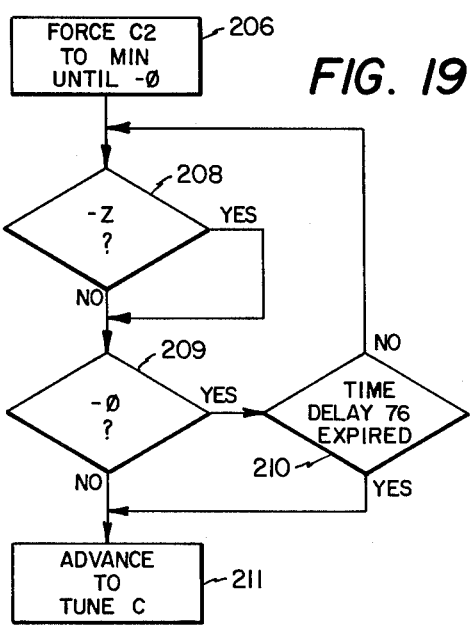

The tuning of the bandpass filter 19 may be more fully understood from following the flow diagrams contained in FIGS. 18 through 22. When the tune sequence counter 35 of FIGS. 5 and 6 advances to the tune A state, the input capacitor C1 is forced to minimum until a $-\phi$ logic signal is detected by the digital error sensor 97. The time delay 73 of FIG. 9 is set at the initiation of the force of C1 to minimum capacitance value at block 200. The timer 73 of FIG. 9 will time for a selected period of time, 1.23 seconds in the preferred embodiment, or a $-\phi$ has been received at logic block 201. During the process, the tune A logic is waiting for a $-\phi$ at decision block 202 or the 1.28 seconds to expire at decision block 203. At decision block 202 if a $-\phi$ has been received, then input capacitor C1 is forced to max until a $-Z$ logic signal is detected and a $-\phi$ is also maintained at block 207. Input capacitor C1 is adjusted on phasing or a $-\phi$ and $-Z$ at blocks 204 and 207 until the expiration of the 1.28 second timer at blocks 203. The logic at block 205 provides an advance A signal and the tune sequence logic 35 goes to the tune B state which is indicated in FIG. 19 to which reference should now be made.

At block 206 output capacitor C2 is forced to minimum until $-\phi$ is received. At decision block 208 output capacitor C2 is continued to be forced to minimum until $-Z$ and a $-\phi$ is received. Output capacitor C2 is then adjusted for a $+\phi$ unless timer 76 has timed out, which, in the preferred embodiment, is a 0.64 second timer. This occurs at decision blocks 209 and 210. Blocks 209 and 210 are decision blocks and if $-\phi$ is detected, then the logic advances to block 211. This process must occur within the time that it takes the timer 76 to time out. Timer 76 is located in FIG. 9 and is a divider for dividing the clock pulses from FIG. 6. When $-\phi$ is no longer present, then the tune sequence counter 35 advances at block 211 to the tune C step.

FIG. 20 illustrates the tune C step and provides at blocks 212 and 213 for the simultaneous tuning of the output capacitor C2 and coupling capacitor C3. C3 is forced max until a $+\phi$ is detected and C2 is tuned for a $+Z$ logic signal. Block 214 continues the process that was established in blocks 212 and 213 until the input reverse and the drop Antenna Interlock logic signals are initiated at the expiration of the time delay 79. At this stage F1 goes low and F2 and F3 go high which drops the interlock for the filter and after the expiration of the timing circuits as provided by time delays 52 and 54 of FIG. 10 the series combination of the tunable bandpass filter 19 and the HF discriminator 21 are reversed at blocks 215 and 216. At block 217 input capacitor C1 is adjusted for a 90° phase relationship as detected by the 90° phase discriminator 23 during a 1 second time period that is provided by the divider 77 of FIG. 10 and at decision block 218. After the 90° phase relationship is obtained or the 1 second timer has timed out then the interlock is dropped (block 219) and the tunable bandpass filter 19 is switched back to the original input and output positions. This occurs during a time delay provided by the RC time constant illustrated by the time delay circuits 52 and 54 of FIG. 10 at decision block 220.

After the switching of the series combination of the tunable bandpass filter 19 and the HF discriminator 21 to the operate input and output connections, coupling capacitor C3 is adjusted for a $+\phi$ and output capacitor C2 is adjusted for $+Z$ (block 221) until the logic signal PR low is received (decision blocks 222 and 226), or the combination of logic states of a $-\phi$ and LT90 (block 225) or $-Z$ and GT90 (block 226). If PR low is received, then the logic control assembly 17 advances to the next step which is advanced to the tune coupler step at block 227. If however, the PR low signal at decision block 222 is not received, then the control logic assembly 17 searches for the GT90 signal at decision block 213. If GT90 is present, then the output capacitor C2 is not tuned further until PR low is present or a $-Z$ signal is detected (block 224). At decision block 226, the logic control assembly 17 searches for PR low and if PR low is found it goes to the advance to tune coupler block at 227; if not, it loops back up to block 221 where the coupling capacitor C3 is tuned for $+\phi$ and the output capacitor C2 is tuned for $+Z$. Returning to decision block 213, if GT90 (greater than 90°) signal is not present then the coupling capacitor C3 is stopped from being tuned until the combination of $-\phi$ and LT90 is obtained or the PR low indication is obtained at decision block 226. The tune sequence counter 35 at the detection of the PR low signal advances to the next stage of tuning the coupler which is provided for in FIG. 2.

The tune coupler state tunes the antenna coupler 9 to match the impedance between the antenna 3 and the bandpass filter 7 and includes the steps of applying system key to the antenna coupler 9 at step 230 and allow the coupler time to tune at block 231. This time is provided by the circuit 80 on FIG. 11. The coupler, upon being properly tuned, removes the request for tune power from the logic control assembly 17 at step 232 and the tune sequence counter advances to the tune filter state at block 233.

Figure 22:
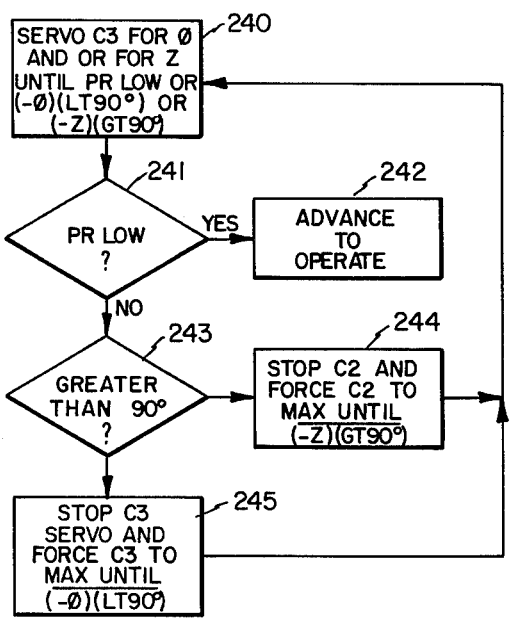

FIG. 22 is a tune filter state and the last state before going into operate and provides for fine tuning the tunable bandpass filter 19 to compensate for any variations that may have been caused by the tuning of the antenna coupler 9. Block 240 adjusts the coupling capacitor C3 for $+\phi$ and the output capacitor C2 for $+Z$ until PR low is received by the logic control assembly 17. This is an OR function and, alternatively, the combination of $-\phi$ and LT90 signals or the combination of a $-Z$ and the GT90 signal can also be tuned for. This process is implemented at decision block 241 where the logic control assembly 17 searches for PR low. If PR low is detected, then the logic control assembly advances to the operate state at block 242. If PR low is not present, then at decision block 243 the control logic assembly 17 looks for the GT90 signal. If GT90 is present, then the tuning of the output capacitor C2 is stopped and forced to the maximum limit until a $-Z$ and GT90 is received by the logic control assembly 17. This function is implemented at block 244. After that step, the logic control assembly 17 returns to block 240. If, on the other hand, greater than 90° is not received, then the coupler capacitor C3 servo is tuned minimum until a $-\phi$ and the LT90 is received at block 245. The logic control assembly continues searching for PR low until it is obtained, in which case the tune sequence counter advances to the operate stage.

Many changes and modifications in the above described invention can, of course, be carried out without departing from the scope thereof. Accordingly, the invention is intended to be limited only by the scope of the appended claims.

We claim:

1. A broadband filter and tuning system for filtering signals between a signal source and a load, the broadband filter and tuning system comprising:

tunable bandpass filter means having an input terminal and an output terminal for passing signals centered around a selectable frequency, the tunable bandpass filter means being located between the signal source and the load;

substitute load;

transfer relay means for reversing the connection of the tunable bandpass filter means by connecting the output terminal of the tunable bandpass filter means to the signal source and the input terminal of the tunable bandpass filter means to the substitute load in response to a first control signal and for reconnecting the input terminal of the tunable bandpass filter means to the signal source and the output terminal of the tunable bandpass filter means to the load in response to a second control signal; and logic control means for generating the first and second control signals and for adjusting the selectable frequency when the connection of the tunable bandpass filter means is reversed.

2. The broadband filter and tuning system according to claim 1 wherein the tunable bandpass filter means comprises:
a first resonator means for providing a first tank resonance and a second resonator means for providing a second tank resonance.

3. The broadband filter and tuning system according to claim 1 or 2 wherein the tunable bandpass filter means comprises:
band switching means for tuning the tunable bandpass filter means to different bands of frequencies.

4. The broadband filter and tuning system according to claim 2 wherein the first and second resonator means comprises:
a first series connection of three primary windings;
a second series connection of three secondary windings;
switch means for connecting the input terminal to a tap position on either the first, second or third winding of the first series connection of three primary windings and the second series connection of three secondary windings.

5. The broadband filter and tuning system according to claim 1 wherein the tunable bandpass filter means comprises:
a transformer means for providing a preselected inductance and having a primary winding and a secondary winding;
first variable capacitor connected in parallel with the primary winding of the transformer means;
second variable capacitor connected in parallel with the secondary winding;
third variable capacitor connected in series between the output terminal and one side of the secondary winding of the transformer means.

6. The broadband filter and tuning system according to claim 1 further comprising:
90° discriminator means for detecting when there is a 90° phase shift between the signal on the input terminal and the signal on the output terminal of the tunable bandpass filter means.

7. The broadband filter and tuning system according to claim 6 further comprising:
an HF discriminator means connected to the input terminal of the tunable bandpass filter means for detecting phase, forward power and reflected power of the signal applied to the input terminal of the tunable bandpass filter means as well as the impedance offered to the signal applied thereto.

8. The broadband filter and tuning system according to claim 7 further comprising:
reflected power discriminator for, when connected to the output terminal, providing a digital indication of the reflected power at the output terminal of the tunable bandpass filter means.

9. The broadband filter and tuning system according to claim 7 wherein the logic control means comprises:
tune start means for initiating a tune sequence of the tunable bandpass filter means;
means for generating the first control signal after the initiation of the tuning sequence;
tuning means for tuning the tunable bypass filter means; and
second control signal generator means for generating the second control signal.

10. The broadband filter and tuning system according to claim 9 wherein the tunable bypass filter means includes an input variable capacitor, an output variable capacitor, and a coupling capacitor and the tuning means comprises:
a first servo system means for tuning the input capacitor;
a second servo control system means for tuning the output capacitor;
a third servo control system means for tuning the coupling capacitor;
the 90° discriminator means provides a first indication when the phase difference between the signal on the input terminal and the output terminal of the tunable bandpass filter means is greater than 90° and a second indication when the phase difference between the signal on the input terminal and the output terminal of the tunable bandpass filter means is less than 90°;
an impedance detector means for detecting when the impedance is positive (greater than 50 ohms) and when the impedance is negative (less than 50 ohms);
a phase detector for providing a positive indication for positive phase signals applied to the tunable bandpass filter means and to provide a negative indication for negative phase signals applied to the tunable bandpass filter means;
a forward power detector means for detecting the forward power; and
a tune sequence counter means for generating a plurality of tuning states wherein: a first state enables the input capacitor to be tuned for a minus phase relationship; a second state enables the output capacitor to be tuned for a minus phase relationship and a minus impedance relationship; a third state enables the coupling capacitor to be tuned for a positive impedance relationship and a nonpositive phase indication; a fourth state enables the first control signal and provides for tuning the input capacitor for a 90° phase relationship between the input terminal and the output terminal of the tunable bandpass filter means; and a fifth state causes the second control signal to be provided and for adjusting the coupling capacitor for a positive phase indication and the output capacitor for a minus impedance indication.

11. A method of filtering signals between a signal source and a load comprising:
tunable bandpass filter means having an input terminal and an output terminal for passing signals centered around a selectable frequency through a tunable bandpass filter means located between the signal source and the load;
reversing the connection of the tunable bandpass filter means by connectng the output terminal of the tunable bandpass filter means to the signal source and the input terminal of the tunable bandpass filter means to a substitute load in response to a first control signal; reconnecting the input terminal of the tunable bandpass filter means to the signal source and the output terminal of the tunable bandpass filter means to the load in response to a second control signal;

generating the first and second control signals; and adjusting the selectable frequency when the connection of the tunable bandpass filter means is reversed.

12. The method according to claim 11 wherein the steps of generating the first control signal, second control signal and adjusting the tunable bandpass filter comprises;

initiating a tune sequence of the tunable bandpass filter;

generating the first control signal after the initiation of the tuning sequence;

tuning the tunable bandpass filter means; and generating the second control signal.

13. The method according to claim 12 wherein the tunable bandpass filter means includes an input variable capacitor, an output variable capacitor, and a coupling capacitor, and the steps of tuning the tunable bandpass filter means comprises:

providing a first indication when the phase difference between the signal on the input terminal and the output terminal of the tunable bandpass filter means is greater than 90° and a second indication when the phase difference between the signal on the input terminal and the output terminal of the tunable bandpass filter means is less than 90°;

detecting when the impedance is positive (greater than 50 ohms) and when the impedance is negative (less than 50 ohms);

providing a positive indication for positive phase signals applied to the tunable bandpass filter means and providing a negative indication for negative phase signals applied to the tunable bandpass filter means;

detecting the forward power;

generating a plurality of tuning states for: enabling the input capacitor to be tuned for a minus phase relationship to a first state; enabling the output capacitor to be tuned for a minus phase relationship and a minus impedance relationship at a second state; enabling the coupling capacitor to be tuned for a positive impedance relationship and a nonpositive phase indication at a third state; enabling the first control signal and providing for tuning the input capacitor for a 90° phase relationship between the input terminal and the output terminal of the tunable bandpass filter means at a fourth state; and generating the second control signal and adjusting the coupling capacitor for a positive phase indication and the output capacitor for a minus impedance indication at a fifth state.

* * * * *